United States Patent [19]

Ooishi

[11] Patent Number: 6,104,648
[45] Date of Patent: Aug. 15, 2000

[54] SEMICONDUCTOR MEMORY DEVICE HAVING A LARGE BAND WIDTH AND ALLOWING EFFICIENT EXECUTION OF REDUNDANT REPAIR

[75] Inventor: Tsukasa Ooishi, Hyogo, Japan

[73] Assignee: Mitsubishi Denki Kabushiki Kaisha, Tokyo, Japan

[21] Appl. No.: 09/400,848

[22] Filed: Sep. 21, 1999

[30] Foreign Application Priority Data

Feb. 12, 1999 [JP] Japan ................................... 11-033874

[51] Int. Cl.[7] .................................................. G11C 7/00
[52] U.S. Cl. ..................................... 365/200; 365/230.02
[58] Field of Search .............................. 365/200, 230.03, 365/230.06, 189.05, 189.07, 230.02

[56] References Cited

U.S. PATENT DOCUMENTS

| | | | |
|---|---|---|---|
| 5,687,125 | 11/1997 | Kikuchi | 365/200 |
| 5,892,718 | 4/1999 | Yamada | 365/200 |
| 5,978,290 | 11/1999 | Fujita | 365/200 |

FOREIGN PATENT DOCUMENTS

| | | |
|---|---|---|
| 8-8344 | 1/1996 | Japan . |
| 8-77793 | 3/1996 | Japan . |

*Primary Examiner*—Son Mai
*Attorney, Agent, or Firm*—McDermott, Will & Emery

[57] ABSTRACT

A memory cell array includes a normal memory cell array divided into a plurality of memory blocks, a row redundant circuit and a column redundant circuit. Independent data lines are provided for the normal memory cell array, the row redundant circuit and the column redundant circuit, respectively. A data line shift circuit selectively connects each data I/O line to a global data bus. A redundant control circuit generates a shift setting signal corresponding to the defective address for setting a connection form in a data line shift circuit when an address signal matches with a defective address.

19 Claims, 24 Drawing Sheets

EACH BIT SIGNAL OF CSFT (8 BITS)

SEMICONDUCTOR MEMORY DEVICE HAVING A LARGE BAND WIDTH AND ALLOWING EFFICIENT EXECUTION OF REDUNDANT REPAIR

BACKGROUND OF THE INVENTION

1. Field of the Invention

The present invention relates to a semiconductor memory device, and particularly a semiconductor memory device which has a structure of a memory cell array capable of simultaneously handling many I/O data, and can efficiently execute redundant repair when a failure occurs in a memory cell.

2. Description of the Background Art

In accordance with development of information communications technology in recent years, it has been demanded to provide semiconductor memory devices which have increased memory capacities, and further can perform fast and parallel handling of many data. As a typical example, these features are required in the case when the device is used for data processing of image data.

For satisfying the above demand, semiconductor memory devices having a so-called multi-bank and multi-I/O line structure have been increasingly used. The above structure of the semiconductor memory device has a plurality of banks each allowing independent reading and writing, and is provided with a large number of parallel I/O lines for allowing simultaneous handling of large volumes of data.

In the semiconductor memory device having a large-scaled memory cell array, it is important to employ an appropriate redundant repair technique for ensuring intended yields of products. According to the redundant repair technique, a defect in memory cells which occurred during manufacturing is repaired by a spare memory cell in a redundant circuit which is already prepared on the same chip.

With increase in memory capacity, it is desired or required to perform the redundant repair efficiently. For example, Japanese Patent Laying-Open No. 8-8344 has disclosed a technique of shift redundancy, in which redundant repair is performed a data line at a time by successively shifting the connections between the data lines. This prior technique will be referred to as a "prior art 1" hereinafter.

In addition, Japanese Patent Laying-Open No. 8-77793 has disclosed a technique, which will be referred to as a "prior art 2" hereinafter. In this prior art 2, a plurality of memory cell arrays (corresponding to banks), each of which allows read/write of data independently of the other memory cell arrays, commonly use a redundant circuit so that an efficient layout design can be performed.

However, the foregoing prior arts 1 and 2 would cause a problem if they were applied to the semiconductor memory device having the foregoing multi-bank and multi-I/O line structure without modification or change.

In the prior art 1, replacement of memory cells with spare cells is not performed a row at a time or a column at a time, but is performed by shifting the form of connection, which is made between data lines in the position including the defective memory cell. However, the setting for shifting the connection between data lines is designated in a fixed manner based on address program information, which is stored in advance in fuse elements or the like. Accordingly, if this prior art is applied to the multi-bank structure, the enormous number of fuse elements are required. The fuse element has a relatively large area, and therefore is not suitable to high-density integration. Thus, the fuse elements significantly affect the layout design.

According to the prior art 2, the units (banks) in the memory cell array, each of which can perform the read/write operations independently of the others, commonly use the same redundant circuit. According to this structure, it is necessary for input/output of data to provide switch circuits which can transmit data between respective data I/O lines and the redundant circuit. In the multi-bank and multi-I/O line structure, the required switch circuits are extremely large in number, and therefore the redundant repair circuit requires an extremely large area.

SUMMARY OF THE INVENTION

An object of the invention is to provide a structure of a semiconductor memory device having a structure of a memory cell array, which is provided with a large number of banks and a large number of data I/O lines and allows simultaneously handling of large volumes of data, and also having a redundant repair circuit which can efficiently perform redundant repair when a defect occurs in a memory cell.

In summary, the invention provides a semiconductor memory device for reading or writing storage data in accordance with a row address signal and a column address signal, including a memory cell array, a plurality of redundant row circuits, a third number of data buses, a plurality of data I/O lines, a redundant row control circuit and a data line connection switch circuit.

The memory cell array has normal memory cells arranged in rows and columns, and is divided into memory cell blocks arranged in a first number of rows and a second number of columns.

Each of the redundant row circuits is provided commonly to the first number of memory cell blocks neighboring in the column direction, and include spare storage elements arranged in rows and columns.

The third number of data buses are provided commonly to the respective memory cell blocks for transmitting the storage data to be read or written.

The plurality of data I/O lines are provided for transmitting the storage data, and include the third number of normal data I/O lines provided commonly to the first number of memory cell blocks neighboring to each other in the column direction. Each of the normal data I/O lines is provided for a fourth number of columns of the normal memory cells, and a plurality of spare row data I/O lines provided corresponding to the normal data I/O lines, respectively, and each provided for the fourth number of columns of the spare storage elements.

The redundant row control circuit instructs a redundant repair operation when the row address signal matches with at least one of defective row addresses in the normal memory cells.

The data line connection switch circuit is controlled by the redundant row control circuit, and selects one line from each set of the normal I/O line and the spare row data I/O line for connecting the selected lines to the corresponding data buses, respectively.

According to another aspect of the invention, the invention provides a semiconductor memory device for reading or writing storage data in accordance with a row address signal and a column address signal, including a memory cell array, a plurality of redundant column circuits, a third number of data buses, a plurality of data I/O lines, a redundant column control circuit and a data line connection switch circuit.

The memory cell array has normal memory cells arranged in rows and columns, and is divided into memory cell blocks arranged in a first number of columns and a second number of columns.

Each of the redundant column circuits is provided commonly to the second number of memory cell blocks neighboring in the row direction, and includes spare memory cells arranged in rows and columns.

The third number of data buses are provided commonly to the respective memory cell blocks for transmitting the storage data to be read or written.

The plurality of data I/O lines are provided for transmitting the storage data, and include the third number of normal data I/O lines provided commonly to the first number of memory cell blocks neighboring to each other in the column direction. Each of the normal data I/O lines is provided for a fourth number of columns of the normal memory cells, and spare column data I/O lines each arranged for the fourth number of spare memory cells.

The redundant column control circuit instructs a redundant repair operation when the column address signal matches with at least one of defective column addresses in the normal memory cells.

The data line connection circuit connects the third number of normal data I/O lines to the third number of data buses in the normal operation, respectively, and is controlled by the redundant column control circuit to connect the third number of data I/O lines selected from the normal data I/O lines and the spare column data lines to the third number of data buses, respectively, in said redundant repair operation.

According to still another aspect of the invention, a semiconductor memory device for reading and writing storage data in accordance with a row address signal and a column address signal, includes a memory cell array, a plurality of redundant row circuits, a plurality of redundant column circuits, a third number of data buses, a plurality of data I/O lines, a redundant row control circuit, a redundant column control circuit, a first data line connection switch circuit and a second data line connection circuit.

The memory cell array has normal memory cells arranged in rows and columns, and is divided into memory cell blocks arranged in a first number of rows and a second number of columns.

Each of the redundant row circuits is provided commonly to the first number of memory cell blocks neighboring in the column direction, and includes spare storage elements arranged in rows and columns.

Each of the redundant column circuits is provided commonly to the second number of memory cell blocks neighboring in the row direction, and includes spare memory cells arranged in rows and columns.

The third number of data buses are provided commonly to the respective memory cell blocks for transmitting the storage data to be read or written.

The plurality of data I/O lines are provided for transmitting the storage data, and include a third number of normal data I/O lines provided commonly to the first number of memory cell blocks neighboring to each other in the column direction. Each of the normal data I/O lines is arranged for the fourth number of columns of the normal memory cells, and a plurality of spare row data I/O lines corresponding to the third number of normal data I/O lines, respectively, and each arranged for the fourth number of columns of the spare storage elements, and spare column data I/O lines each arranged for the fourth number of columns of the spare memory cells.

The redundant row control circuit issues a row replacement instructing signal when the column address signal matches with at least one of defective row addresses in the plurality of predetermined normal memory cells.

The redundant column control circuit issues a data line shift control signal for instructing redundant repair operation when the column address signals matches with at least one of the defective column addresses in the plurality of preset normal memory cells.

The first data line connection switch circuit selects one from each set of the normal data I/O line and the spare row data I/O line in accordance with the row replacement instructing signals.

The second data line connection circuit selectively connects the third number of data I/O lines among the third number of normal data I/O lines selected by the first data line connection switch circuit and the spare column data I/O lines to the third number of data I/O buses in accordance with the data line shift control signals, respectively.

Accordingly, a major advantage of the invention is that the redundant row circuit is commonly used by the plurality of memory cell blocks, and the data I/O lines are arranged independently so that the layout design of the redundant row circuit can be performed efficiently, and the data read/write operations can be performed fast.

The redundant column circuit is commonly used by the plurality of memory cell blocks, and the data I/O lines are arranged independently for executing the redundant repair a data line at a time. Thereby, the layout design of the redundant column circuit can be performed efficiently, and the data read/write operations can be performed fast.

Further, both the redundant row circuit and the redundant column circuit are commonly used by the plurality of memory cell blocks, and the data I/O lines are arranged independently for executing the redundant column repair a data line at a time. Thereby, the layout design of the redundant circuit can be performed efficiently, and the data read/write operations can be performed fast.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described below in detail with reference to the drawings. In the figures, the same reference numbers indicate the same or corresponding portions, respectively.

First Embodiment

Figure 1:
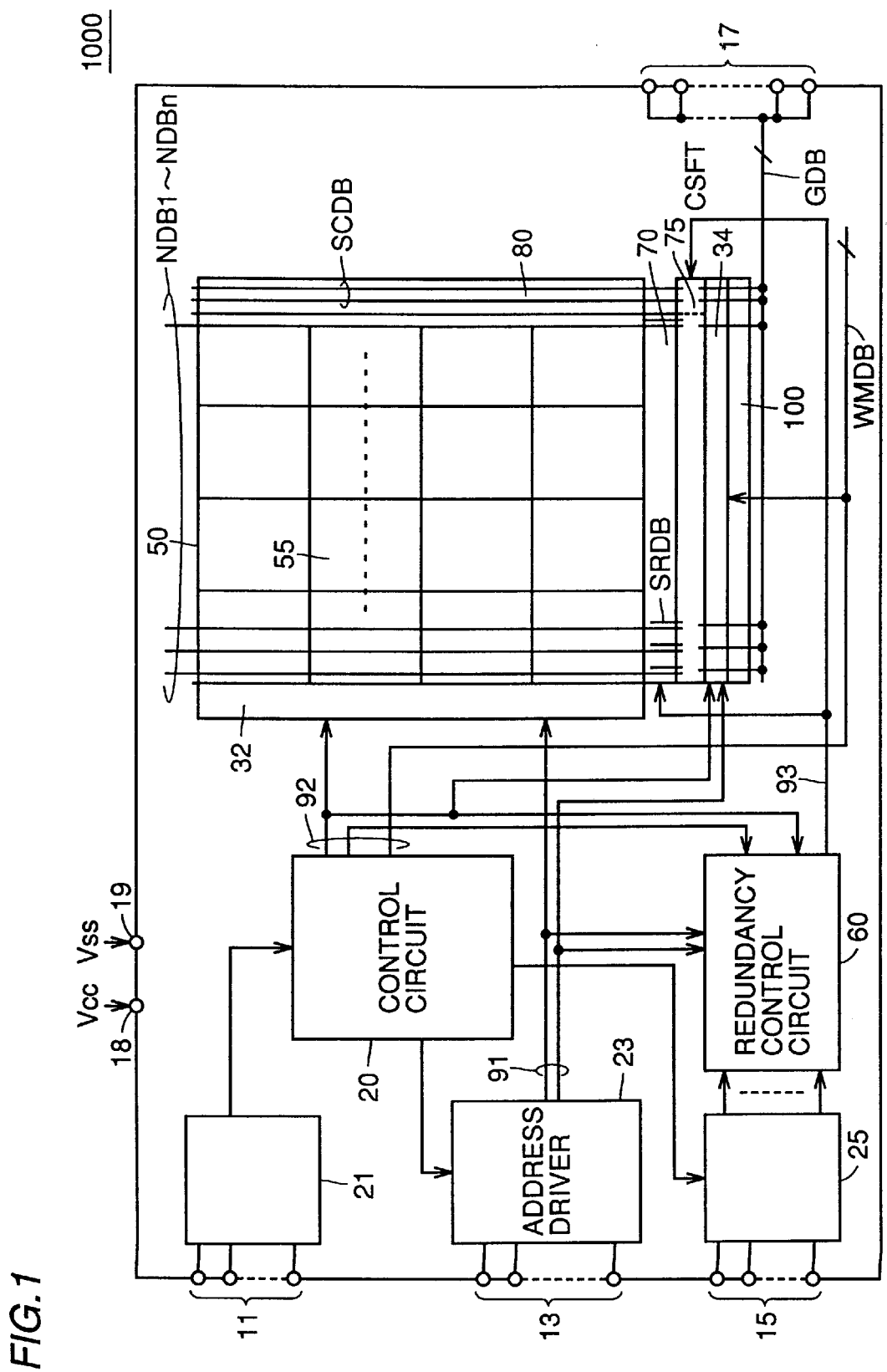
FIG. 1 is a schematic block diagram showing a whole structure of a semiconductor memory device 1000 of a first embodiment of the invention.

FIG. 1 is a schematic block diagram showing a whole structure of a semiconductor memory device 1000 of a first embodiment of the present invention.

Referring to FIG. 1, semiconductor memory device 1000 includes a control circuit 20 which receives external control signals /RAS, /CAS, /W and /CS applied from an external control signal input terminal group 11 via a signal buffer 21, and decodes them to generate internal control signals, a command data bus 92 which transmits the internal control signals sent from control circuit 20, and a memory cell array 50 in which memory cells are arranged in rows and columns.

Memory cell array 50 is divided into, e.g., 16 memory cell blocks 55 as shown by way of example in FIG. 1. Semiconductor memory device 1000 has a storage capacity of, e.g., 1 Gbits, in which case each memory cell block has a capacity of 64 Mbits. Each memory cell block has a structure allowing data reading and writing independently of the others.

Semiconductor memory device 1000 further includes an address driver 23, which receives an external address signal via an external address signal input terminal 13, and generates an internal address signal. The internal address signal issued from address driver 23 is transmitted to memory cell array 50 and a redundant control circuit 60 via an address bus 91.

Semiconductor memory device 1000 further includes a data I/O terminal group 17, and a global data bus GDB for transmitting storage data between memory cell array 50 and data I/O terminal group 17. For memory cell array 50, the device further includes a row decoder 32 for selecting a row (word line) of the memory cells, and a column decoder 34 for selecting a column (bit line pair) of the memory cells corresponding to the address signal.

Memory cell array 50 includes a normal memory cell array formed of 16 memory cell blocks 55, a column redundant circuit 80 for repairing the memory cell column including a defective memory cell, and a row redundant circuit 70 for repairing the memory cell row including the defective memory cell. Normal data lines NDB1–NDBn (n: natural number) are provided for transmitting read/write data of the normal memory cell array. Each memory cell block 55 can be independently activated for reading and writing data, as already described. In this embodiment, it is assumed that the four memory cell blocks neighboring to each other in the row direction form one bank group, and can be simultaneously activated for the purpose of simultaneously handling especially large volumes of data. Thus, data of n in number can be simultaneously handled by selecting and activating one bank group.

In row redundant circuit 70, read/write data is transmitted via a spare row data line SRDB. In column redundant circuit 80, read/write data is transmitted via a spare column data line SCDB.

Redundant control circuit 60 controls operations of row and column redundant circuits 70 and 80.

Data related to a defective address used for redundant repair is written into a defective address program circuit 25 via a defective address input terminal group 15. Defective address program circuit 25 is provided with elements such as electric fuses, and can store the supplied data related to the defective address in a nonvolatile manner.

Redundant control circuit 60 makes a comparison between the address signal issued from address driver 23 and the defective address based on the data related to the defective address and transmitted by defective address program circuit 25. If the redundant repair is required, redundant control circuit 60 instructs row and column redundant circuits 70 and 80 to perform the redundant repair operations.

In the redundant repair operation, spare row data line SRDB and spare column data line SCDB are connected to normal data lines by a data line shift circuit 75 which operates under the control of redundant control circuit 60. A peripheral circuit 100 drives read/write data between the global data bus and the memory cell array via a write driver, a read amplifier and others.

Structure of Data Line for Data Read/Write

Figure 2:
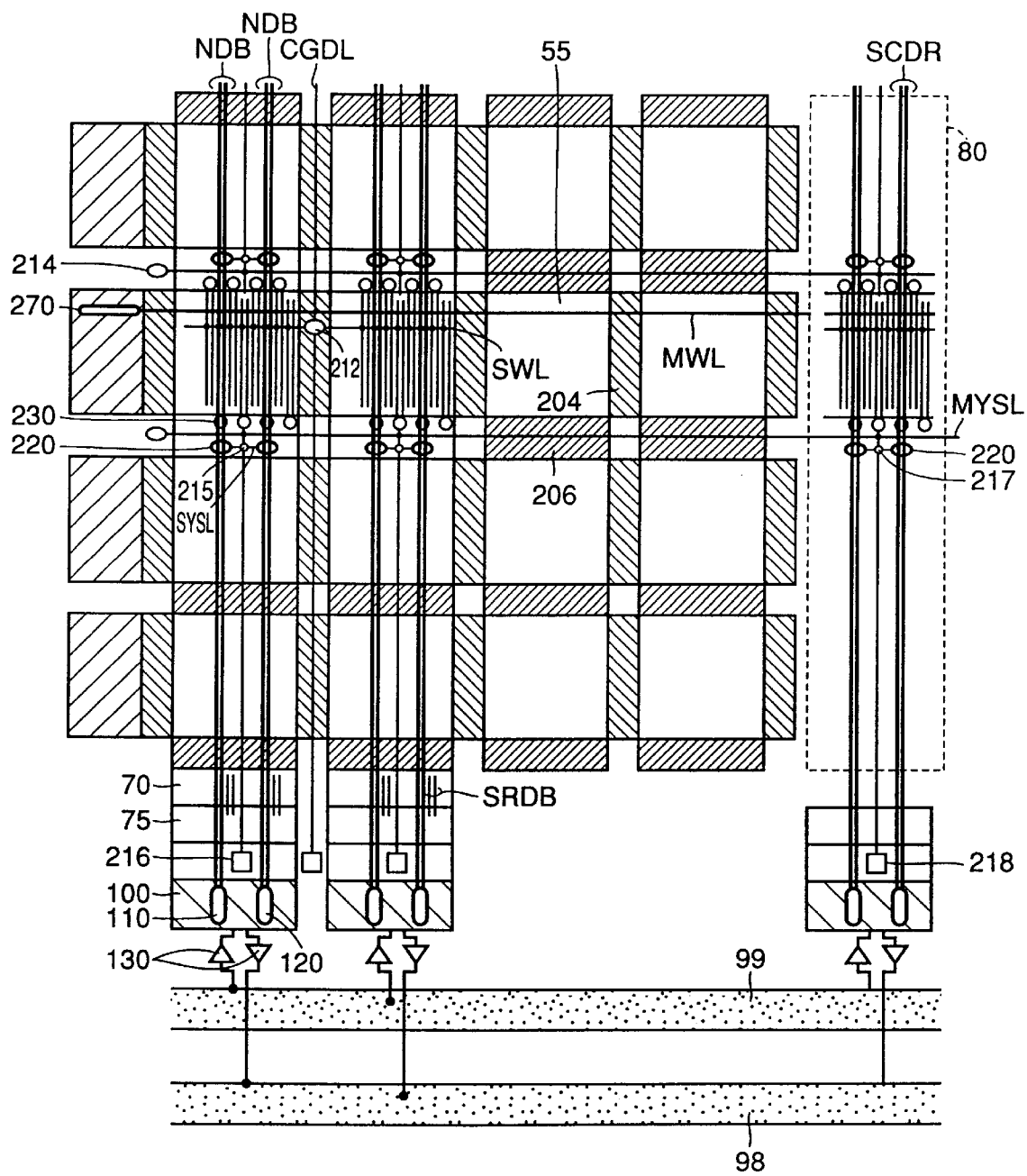
FIG. 2 is a block diagram showing a specific structure of a memory cell array 50.

FIG. 2 is a block diagram showing a form of connection of the data lines in memory cell array 50 shown in FIG. 1.

Referring to FIG. 2, memory cell array 50 is subdivided into memory cell blocks 55 each surrounded by sense amplifier bands 206 and sub-word driver bands 204. Memory cell array 50 can be activated a memory cell block at a time. A main word line MWL extends across the memory cell blocks, and is provided commonly to the memory cell blocks belonging to the same bank group for activating a sub-word driver 212 to be driven. When sub-word driver 212 is activated, corresponding sub-word line SWL is activated. A bit line pair BL and /BL is provided for each column of the memory cells.

The data on bit line pair is amplified by a sense amplifier circuit 230 arranged in sense amplifier band 206. Sense amplifier circuits 230 are arranged at alternate positions on the opposite sides of the memory cell block unit. One normal data line is provided for every four sense amplifier circuits. As will be described later in greater detail, the normal data lines are divided into a normal read data line pair NRDB and /NRDB, and a normal write data line pair NWDB and /NWDB for allowing transmission of read data and write data independently of each other. However, these lines are generally shown as normal data lines NDB in FIG. 2.

Row redundant circuit 70 for repairing the row including the defective memory cell is arranged outside the region of the normal memory cell array. For transmitting the I/O data, row redundant circuit 70 is provided with row spare data lines SRDB which correspond to normal data lines NDB, respectively, and each are provided for four sense amplifier circuits. Spare row data lines are likewise divided into spare row read data line pair SRRB and /SRRB and spare row write data line pair SRWB and /SRWB for allowing independent transmission of the read data and the write data. In FIG. 2, however, these divided lines are generally referred to as spare row data line SRDB.

Likewise, column redundant circuit 80 for repairing the column which includes the defective memory cell is arranged outside the region of the normal memory cells. In column redundant circuit 80, spare column data line SCDB is provided for every four sense amplifier circuits. The spare column data line is divided into spare column read data line pair SCRB and /SCRB and spare column write data line SCWB and /SCWB for allowing independent transmission of the read data and write data. In FIG. 2, however, the divided lines are generally referred to as spare column data line SCDB. Global data bus GDB is divided into a data bus portion which is arranged in a region 98 for transmitting the read data and a data bus portion which is arranged in a region 99 for transmitting the write.

The normal data lines, spare column data lines and spare row data lines are connected to data line shift circuit 75. Data line shift circuit 75 sets or determines the form of connection between each data line and global data bus regions 98 and 99 in accordance with the result of determination by the redundant control circuit. In accordance with the connection form set by data line shift circuit 75, read/write data is transmitted between each data line and global data bus regions 98 and 99 via a write driver 110, a read amplifier 120 and an interface 130 in peripheral circuit 100.

The data on global data bus GDB is then transmitted to data I/O terminal group 17 via circuits relating to input/ output. Alternatively, the data is directly transmitted to the logic portion if the chip is provided with the memory and logic circuits in a mixed fashion.

More specifically, memory cell array 50 has memory blocks 55 arranged in four row and four columns, and is provided with main word driver groups which correspond to the respective rows, and are included in row decoder 32. Each memory cell block is provided with sub-word driver band 204 and sense amplifier band 206. A segment decode line CGDL is arranged along the data line direction in memory cell array, and extends across the sub-word driver band. Segment decode line CGDL includes a bank select line BSL, a select line SL and a reset line RSL.

First, an operation for row-related selection will be described. In accordance with the row address signal, main word driver 210 selectively activates main word line MWL. Main word line MWL and segment decode line CGDL activate corresponding sub-word driver 212, and thereby sub-word line SWL is activated so that the access transistor connected to the selected memory cell is turned on. It is assumed that select lines SL generally represent four select lines SL0–SL3. Likewise, reset lines RSL generally represent four reset lines RSL0–RSL3.

In accordance with the above, the data is output onto bit line pair BL and /BL provided corresponding to the selected memory cell column. In accordance with the same timing, the redundancy determining circuit compares the row address signal with the defective address stored in the defective address program circuit, and activation of the redundant row included in row redundant circuit 70 is instructed, if necessary.

Then, the operation for column-related selection will be described. First, a segment YS driver 214 activates main YS line MYSL. Main YS line MYSL includes four read source lines RGL0–RGL3 as well as four write activation lines WRL0–WRL3, extends across the respective memory cell block units and is arranged commonly to the memory cell blocks belonging to the same bank group.

For the main YS line, sub-YS lines are arranged as select lines in a hierarchically lower order. The sub-YS lines are activated by sub-YS drivers 215, and include sub-read source lines SRGL0–SRGL3 as well as four sub-write activation lines SWRL0–SWRL3. The sub-YS line is activated by a YS segment decoder 216 for selectively activating a partial area in a region corresponding to the same main YS line. Finally, corresponding I/O gate 220 is selectively activated in accordance with activation of sub-YS line SYSL, and thereby one of the four sense amplifier circuits is connected to one normal data line NDB.

In the following description, read source lines RGL0–RGL3 are generally referred to as read source lines RGL, and sub-read source lines SRGL0–SRGL3 are generally referred to as sub-read source lines SRGL, if necessary. Likewise, write activation lines WRL0–WRL3 are generally referred to as write activation lines WRL, and sub-write activation lines SWRL0–SWRL3 are generally referred to as sub-write activation lines SWRL.

In accordance with the same timing as the column selection, address comparison and determination are effected on the column address signal for determining whether the redundant repair is necessary or not. However, the column selection by the column redundant circuit is performed by a spare sub-YS line which is activated by a spare YS driver. The spare YS driver is controlled by a spare YS decoder 218 which is controlled independently of the comparison and match-determination, and the spare YS driver which is controlled by main YS line MYSL provided commonly to the normal memory cell array. Thus, in response to the activation of the spare sub-YS line, the corresponding I/O gate is selectively activated so that the output signal of one of the four sense amplifiers is transmitted onto the spare column data line.

The result of redundant repair determination is transmitted to data line shift circuit 75, and is utilized for selecting the connection between the spare column I/O line and the global data bus line. Accordingly, the spare sub-YS line is always activated regardless of the result of redundancy determination which is performed between the programmed defective address and the supplied column address. Therefore, the access in the read operation can be performed fast.

Figure 3:
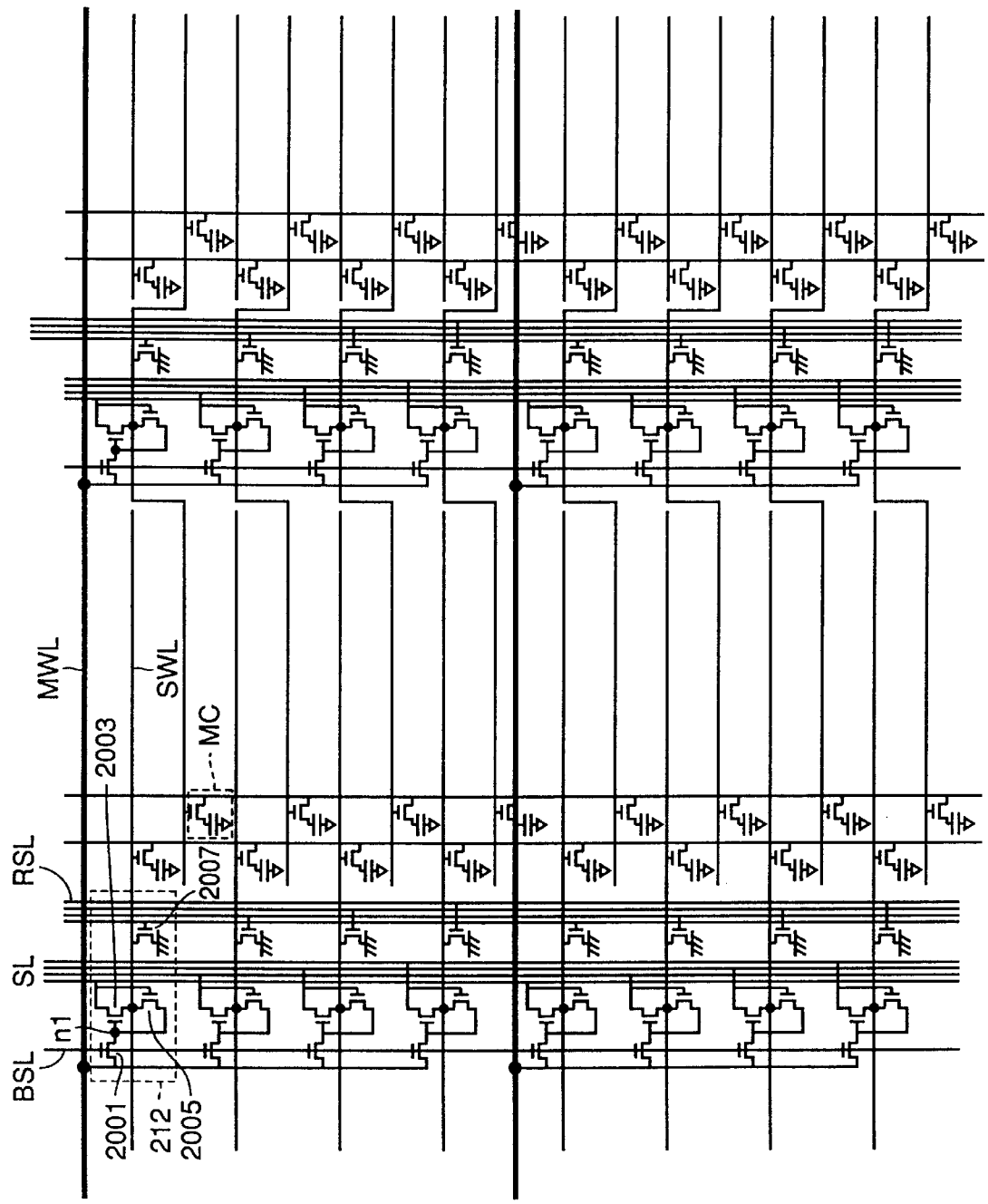
FIG. 3 is a circuit diagram showing a specific structure of a sub-word driver band.

FIG. 3 is a circuit diagram showing a specific structure of sub-word driver band 204. Referring to FIG. 3, sub-word driver 212 includes a select transistor 2001 which has a gate controlled by bank select line BSL, and is arranged between the main word line and an internal node n1, a transistor 2003 which has a gate connected to node n1, and is connected between one (SL0) of select lines SL and sub-word line SWL, and a transistor 2005 which carries a gate potential controlled by select line SL0 also controlling a gate potential of transistor 2003, and is connected between sub-word line SWL and node n1. Sub-word driver 212 further includes a transistor 2007 which carries a gate potential controlled by reset line RSL0, and is arranged between sub-word line and the ground potential.

In the other sub-word drivers, similar structures are present between main word lines MWL and sub-word lines SWL. Owing to the above structure, word line SWL is activated (and attains a high potential) in response to the activation of corresponding main word line MWL as well as activation of bank select line BSL and activation of one of select lines SL. Further, sub-word line SWL is discharged to the ground potential in response to selective activation of corresponding reset line RSL.

In the example shown in FIG. 3, one main word line MWL controls four sub-word lines SWL in each (bank memory cell block). The sub-word line SWL to be actually selected is specified by activation of one of the select lines SL. Bank select line BSL attains the level of a boosted voltage (Vpp) when it is active, and will change to ground potential Vss level (which will be merely referred to as "Vss level" hereinafter) after sub-word line SWL is activated. In this case, the latch circuit formed of transistors 2003 and 2005 holds the active state of bank select line BSL. The potential levels on select line SL and reset line RSL are controlled to be complementary with each other.

During standby, bank select line BSL is at Vss level, select line SL is at Vss level and reset line RSL is at power supply potential Vcc level (which will also be referred to as a "Vcc level" hereinafter). In the activating operation, the corresponding reset line is set to Vss level so that bank select line BSL corresponding to sub-word line SWL to be activated is activated, and the potential level on this bank select line BSL attains boosted potential Vpp level.

Then, main word line MWL is activated and attains Vcc level. At the substantially same time as activation of main word line MWL, one of select lines SL attains Vcc level, and sub-word line SWL attains the level of Vcc–Vth (Vth is a threshold voltage of transistor). Thereafter, the potential on bank select line BSL changes to Vss level, and electric charges are confined in the latch circuit within the sub-word driver.

While this state where the charges are confined by transistors 2003 and 2005 is kept, the potential level on one of select lines SL is raised to boosted potential Vpp level, whereby the level on sub-word line SWL changes to boosted potential Vpp level.

In the reset operation, the potential on bank select line is raised to power supply potential Vcc level, and the potential on select line SL is set to Vss level. Further, the potential on reset line is set to Vcc level. Thereby, charges stored on sub-word line SWL are discharged. Owing to the above structure, sub-word line driver 210 can be formed of only the four elements, i.e., the four N-channel MOS transistors, and therefore the required elements can be reduced in number.

Further, the activation of the main word line is performed by the one-shot pulse signal. More specifically, when transistors 2003 and 2005 in sub-word driver 210 corresponding to the selected sub-word line once hold the main word line in the active state, the potential level on the main word line is reset.

Even in the structure where the plurality of banks are aligned in the main word line direction as shown in FIG. 2, the potential level on the main word line does not affect sub-word driver 210 unless bank select line BSL is activated. Therefore, the two memory cell blocks (banks) neighboring to each other in the row direction can be operated independently of each other.

Figure 4:
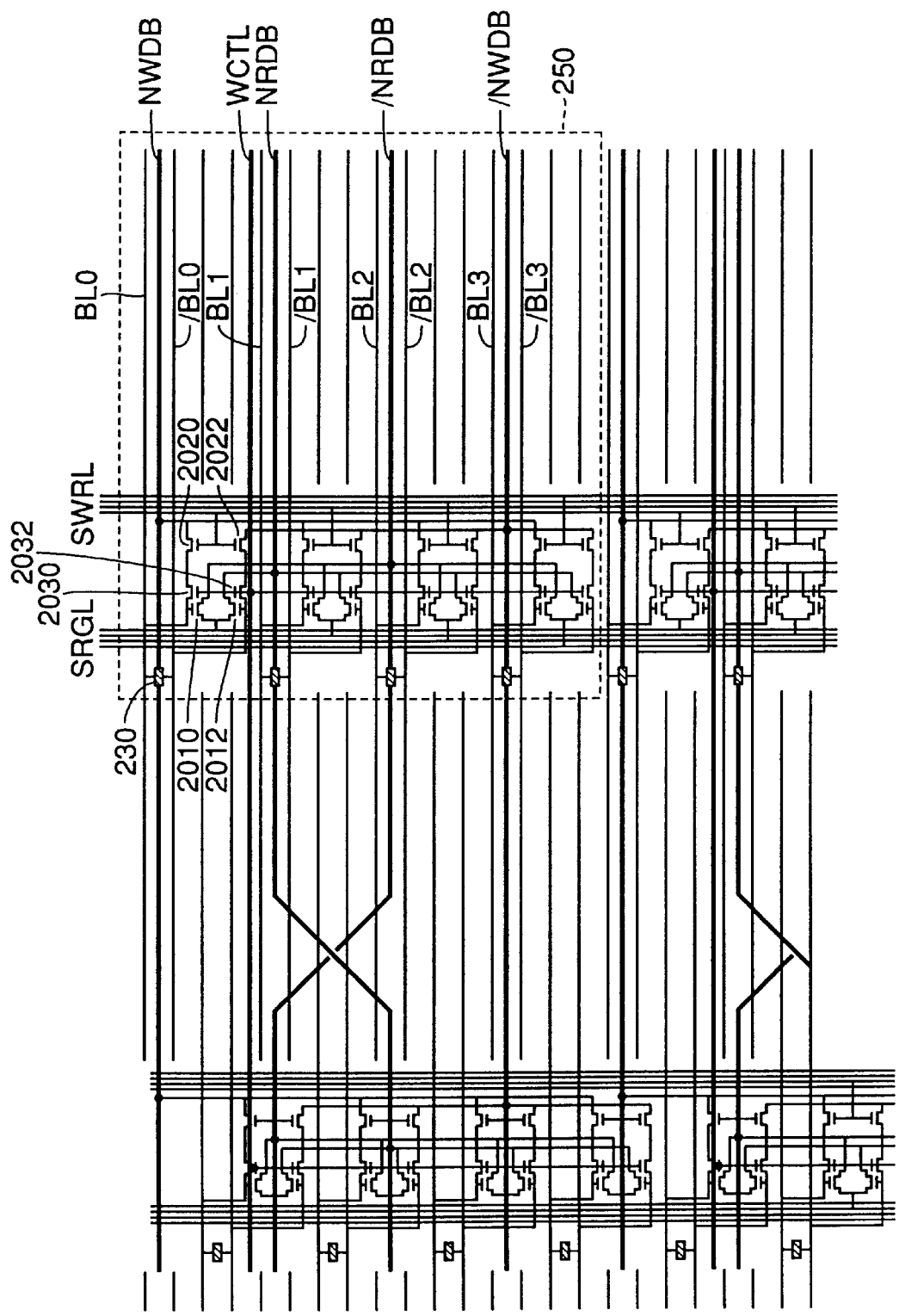
FIG. 4 is a circuit diagram showing connection between sense amplifiers and data lines in a normal memory cell array.

FIG. 4 is a circuit diagram showing connection between the sense amplifiers and the data lines in the normal memory cell array.

Referring to FIG. 4, four sense amplifiers are related to one normal data line, and are selectively connected to the normal data line thus related, as already described. The normal data line includes normal read data line pair NRDB and /NRDB and normal write data line pair NWDB and /NWDB, which are provided independently of each other for performing the data read operation and the data write operation independently of each other.

Four sense amplifier circuits 230 are included in a region 250. Although the specific structure of sense amplifier circuit 230 will not be described, sense amplifier circuit 230 in this embodiment includes a sense amplifier formed of cross-coupled P- and N-channel MOS transistors, and equalize transistors for equalizing bit line pair BL and /BL. In this embodiment, the sense amplifiers and the bit lines are in such a relationship that the sense amplifiers are arranged in the central regions of the bit lines. This arrangement can increase the speed of data reading from the memory cell to the sense amplifier node, and can also increase the equalizing speed. This is because the arrangement of the sense amplifier in the central region of the bit line can reduce a resistance from the sense amplifier node to the bit line end.

The sense amplifier nodes of sense amplifier circuit 230 are connected to each data line pair via transistor gates. First, selection in the read operation will be described below. The sense amplifier nodes in sense amplifier circuit 230 are connected to normal read data line pair NRDB and /NRDB via read gate transistors 2010 and 2012, respectively. The sources of transistors 2010 and 2012 are selectively set to Vss level by read sub-source line SRGL. The gates of transistors 2010 and 2012 are connected to the sense amplifier nodes of the corresponding sense amplifier circuit 230, and the drains of transistors 2010 and 2012 are connected to the corresponding normal read data line pair NRDB and /NRDB. Thus, four sense amplifier circuits 230 commonly use one read data line pair.

The write operation is as follows. Normal write data line pair NWDB and /NWDB are selectively connected by transistors 2020 and 2022, which are connected between corresponding bit line BL and normal write data line NWDB and between bit line /BL and corresponding normal write data line /NWDB, respectively.

Thus, the sense amplifier nodes of sense amplifier circuits 230 corresponding to bit line pairs BL0 and /BL0–BL3 and /BL3 are selectively connected to normal write data line pair NWDB and /NWDB by transistors 2020 and 2022, of which gate potentials are controlled by corresponding sub-write activation lines SWRL0–SWRL3.

Further, the write operation is performed via transistor gates 2030 and 2032, of which gate potentials are controlled by a write control line WCTL. Transistor gates 2030 and 2032 are employed for performing the data mask operation. In a normal operation, write control line WCTL is precharged to Vcc level, whereby transistors 2030 and 2032 are on, and the data is written into the sense amplifier circuit selected by sub-write activation line SWRL. However, in the case where it is required to stop partially the data writing, and thus the data mask operation is required, the potential on write control line WCTL corresponding to the required portion is changed to Vss level so that the write operation is forcedly stopped. The data mask operation will be described later in greater detail together with the structure of the write driver.

In the data read operation of the above structure, normal read data line pair NRDB and /NRDB is not directly connected to the sense amplifier nodes of the corresponding sense amplifier circuit, and the gates of transistors 2010 and 2012 are driven by the potential levels on the sense amplifier nodes of the sense amplifier circuit so that a change occurs in levels on normal read data line pair NRDB and /NRDB. Accordingly, even when selection of the memory cell column by the column address signal, i.e., the operation of selecting one of sub-read source lines RGL0–RGL3 overlaps with or precedes the amplifying operation by the sense amplifier, the read operation can be performed without data destruction. This can increase the read operation speed, as already described. Further, activation of the sense amplifier is required only in the limited region. Therefore, the operation current peak can be suppressed, and effects such as reduction in power consumption and reduction in noise can be achieved.

Figure 5:
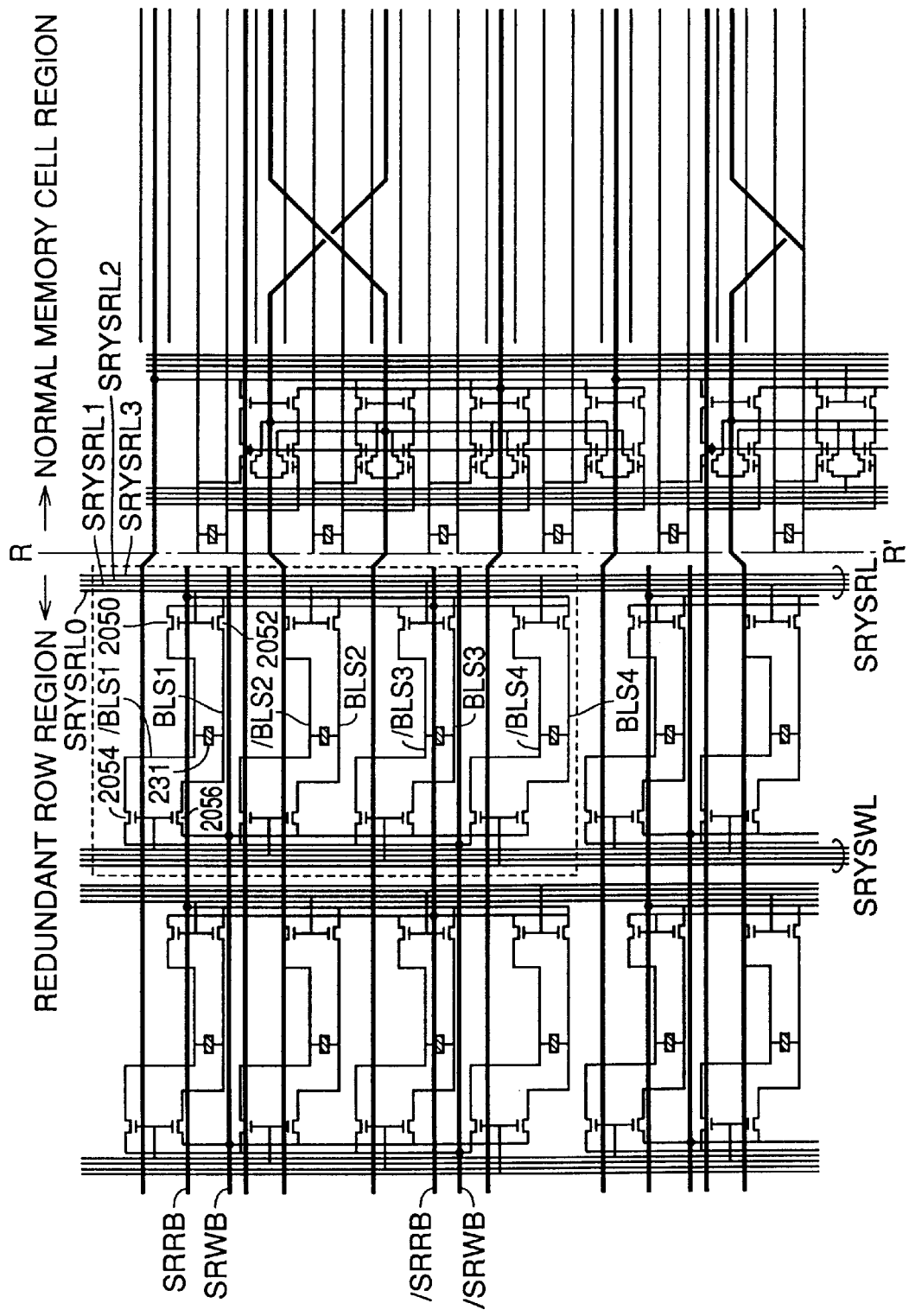
FIG. 5 is a circuit diagram showing a specific structure of a row redundant circuit 70.

FIG. 5 is a circuit diagram showing a specific structure of row redundant circuit 70.

Referring to FIG. 5, a region on the right side of alternate long and short dash line RR' in the figure corresponds to the normal memory cell array shown in FIG. 4. The region on the left side of alternate long and short dash line RR' corresponds to row redundant circuit 70. In row redundant circuit 70, storage data is directly held in sense amplifier circuit 231. Spare bit line pairs BLS and /BLS are provided corresponding to the sense amplifier circuits, respectively. Accordingly, precharging of the sub-bit line pair is not required in the row redundant circuit.

In the row redundant circuit, spare row read data lines SRRB and /SRRB and spare row write data lines SRWB and /SRWB are arranged for every four sense amplifier circuits 231. These data lines in the row redundant circuit have structures independent of the data lines in the normal memory cell array. Owing to the independent structure of these data lines, it is possible to reduce the parasitic resistances and parasitic capacitances of the spare row read data lines and spare row write data lines so that the access time in the read operation of the row redundant circuit can be reduced.

Sense amplifier circuit 231 is connected to spare row read data lines SRRB and /SRRB by transistors 2050 and 2052, of which gate potentials are controlled by a spare row read YS line SRYSRL0. Likewise, sense amplifier circuit 231 is connected to spare row write data lines SRWB and /SRWB by transistors 2054 and 2056, of which gate potentials are controlled by a spare row write YS line SRYSWL0.

In the read operation, the sense amplifier nodes of sense amplifier circuits 231 corresponding to spare bit line pairs BLS0 and /BLS0–BLS3 and /BLS3 are selectively connected to one of the spare row read data lines in accordance with the states of corresponding spare row read YS lines SRYSRL0–SRYSRL3, respectively. Likewise, in the write operation, the sense amplifier nodes of sense amplifier circuits 231 corresponding to spare bit line pairs BLS0 and /BLS0–BLS3 and /BLS3 are selectively connected to one of the spare row read data lines in accordance with the states of corresponding spare row write YS lines SRYSWL0–SRYSWL3, respectively.

Spare row read YS lines SRYSRL generally represent spare row YS lines SRYSRL0–SRYSRL3 provided for the four sense amplifier circuits. This is true also with respect to spare row write YS lines SRYSWL.

Spare row read YS line SRYSRL and spare row write YS line SRYSWL are employed for selecting one from the four redundant rows, and are activated in accordance with the result of comparison which is made by the redundant control circuit between the row address signal and the defective row address stored in the defective address program circuit.

Figure 6:
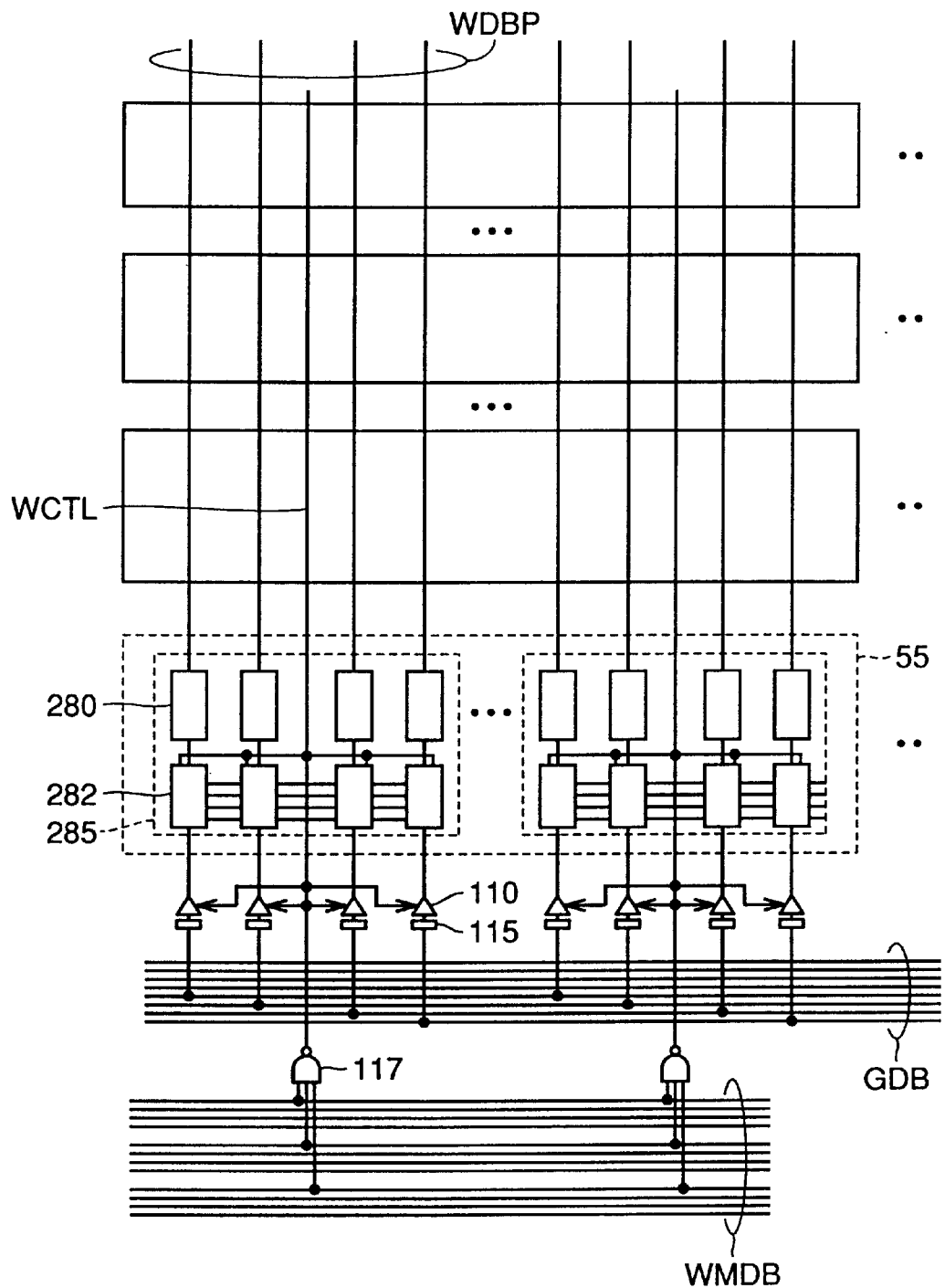
FIG. 6 is a block diagram showing transmission of write data from global data bus to a memory cell array.

The data write operation will be described below in greater detail. FIG. 6 is a schematic block diagram showing transmission of write data from the global data bus region to the memory cell array.

Referring to FIG. 6, global data bus GDB transmits the write data which is applied from data I/O terminal group 17 (or the logic portion in the memory/logic-mixed chip). The write data transmitted via global data bus GDB is written into the memory cell array via data latch circuit 115 and write driver 110.

Write mask data for performing write masking is sent from control circuit 20 via write mask data lines WMDB. The write mask data is a signal instructing and forcing a partial region to stop the data write operation, and is converted into a data mask signal by a mask data decode/latch circuit 117. The data mask signal is transmitted via write control line WCTL.

Write driver 110 is provided for every four memory cell columns including four sense amplifier circuits. A block 280 shown in the figure shows a unit including the four memory cell columns in the memory cell block. Write driver 110 drives the write data to write data line pairs WDBP, which generally represent normal write data line pairs NWDB and /NWDB, spare column write data line pairs SCWB and /SCWB, and spare column write data line pairs SRWB and /SRWB.

A select gate 282 corresponds to the transistor gate, which receives on its gate the signal on the sub-write activation line or the spare row YS line as already described with reference to FIGS. 4 and 5, and connects the sense amplifier circuit corresponding to the selected column address to the write data line.

Write control line WCTL is provided for every four write drivers 110. Thus, one data mask signal can instruct the data mask operation to 16 sense amplifiers (i.e., 16 memory cell columns).

Write data line pair WDBP and write control line WCTL are commonly used by the memory cell blocks neighboring to each other in the column direction, as already described with reference to FIG. 2.

Figure 7:
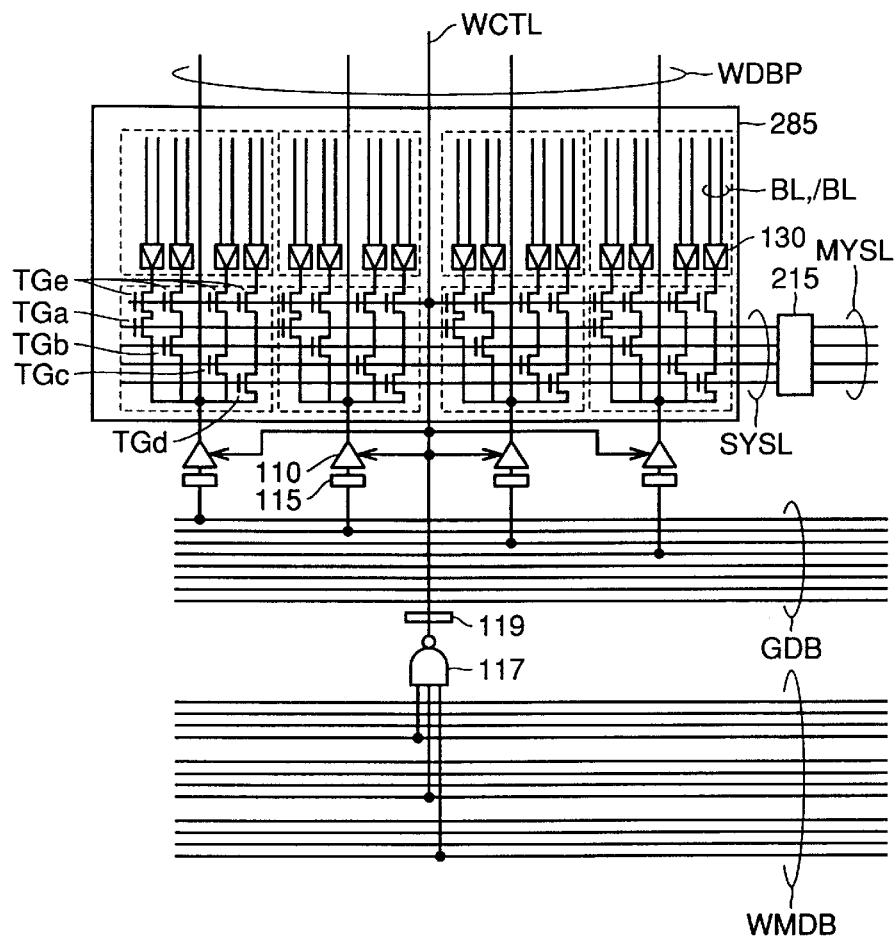
FIG. 7 is a circuit diagram showing connection between write drivers and a memory cell array.

FIG. 7 is a circuit diagram showing connection between write driver 110 and memory cell array. As already described, four sense amplifier circuits 230 are related to one write data line pair WDBP. Transistors TGa–TGd of which gate potentials are controlled by sub-write activation lines SWRL0–SWRL3, respectively, select one from the four sense amplifier circuits, and connect the same to write data line pair WDBP. Thereby, the data written onto write data line pair WDBP by write driver 110 is transmitted onto bit line pair BL and /BL via sense amplifier circuit 230, and the memory cell corresponding to the address signal stores the write data.

Since transistor gates TGe which can receive the write mask signal though write control line WCTL is connected between transistor gates TGa–TGd and the write data line pairs, respectively, the path between the sense amplifier circuit and the write data line pair can be forcedly interrupted even when connection between them is instructed.

Figure 8:
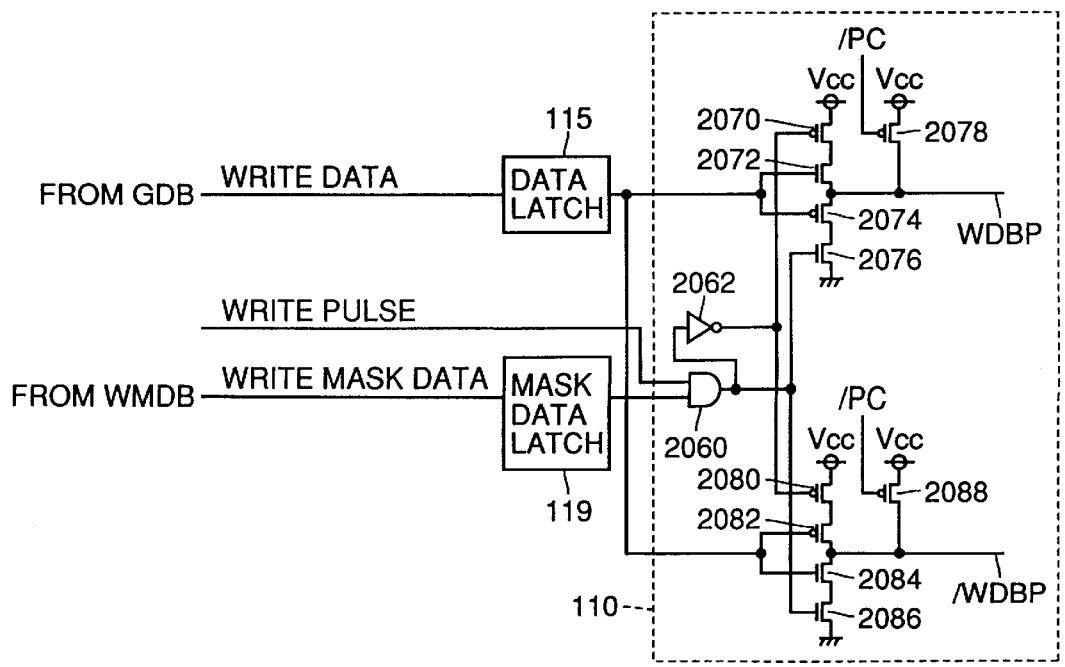
FIG. 8 is a circuit diagram showing a specific structure of the write driver.

Then, the relationship between the structure of write driver 110 and the data mask operation will be described. FIG. 8 is a circuit diagram showing the structure of write driver 110. Referring to FIG. 8, the write data is transmitted from global data bus GDB via data latch circuit 115 to write driver 110. The data mask signal decoded by write mask decoder is latched by a mask data latch circuit 119, and is transmitted to write driver 110. Write driver 110 also receives a write pulse signal which is active during the data write operation.

Write driver 110 includes an AND gate 2060 receiving on its inputs the write pulse signal and the data mask signal, and an inverter 2062 which inverts the output of AND gate 2060. Write driver 110 further includes transistors 2070 and 2072 which are connected in series between power supply potential Vcc and write data line WDB, transistors 2074 and 2076 which are connected between write data line WDB and ground potential Vss, a transistor 2078 provided for precharging write data line WDB to power supply potential Vcc, transistors 2080 and 2082 which are connected between write data line /WDB and power supply potential Vcc, transistors 2084 and 2086 which are connected between write data line /WDB and ground potential Vss, and a transistor 2088 for precharging write data line /WDB to Vcc level.

The write data transmitted to write driver 110 by data latch circuit 115 is supplied to the gates of transistors 2072 and 2074 as well as the gates of transistors 2082 and 2084. Transistors 2072 and 2082 have polarities opposite to those of transistors 2074 and 2084, respectively, so that write data lines WDB and /WDB, which form the write data line pair for one write data, are supplied with data which are complementary with each other.

The output signal of AND gate 2060 is applied to the gates of transistors 2076 and 2086, and the output of inverter 2062 is applied to the gates of transistors 2070 and 2080.

In the case where the data mask signal is active when the write pulse signal is activated, transistors 2072 and 2082 for transmitting the write data onto the write data line are forcedly cut off from power supply potential Vcc, and transistors 2074 and 2084 are forcedly cut off from ground potential Vss so that the write operation is forcedly deactivated. At this time, write data lines WDB and IWDB are floated at the precharged Vcc level.

If the precharged level of the write data line is set to the level of (½)Vcc instead of Vcc, it is possible to reduce further the possibility that the potential level on the write data in the floating state destroys the data of the sense amplifier. For reducing this possibility of data destruction, it is important to set the precharged potential level of the write data line to a value intermediate the ground potential Vss of sense amplifier and power supply potential Vcc. Accordingly, the precharged potentials of the read data line and the write data line may be set to different levels, respectively.

Conversely, if the data mask signal is inactive, transistors 2072, 2074, 2082 and 2084 are connected to power supply potential Vcc or ground potential Vss in accordance with activation of the write pulse signal so that the write data is written onto write data line pair WDB and /WDB.

As shown in FIG. 7, the write mask signal is transmitted to the memory cell array via write control line WCTL, and serves to interrupt the connection between the sense amplifier circuit and the write data line even when the above connection is instructed by the activation of sub-write activation line SWRL. In this manner, the data mask signal can act to operate the write driver in the tristate conditions, and can deactivate the data write operation for every constant range.

Figure 9:
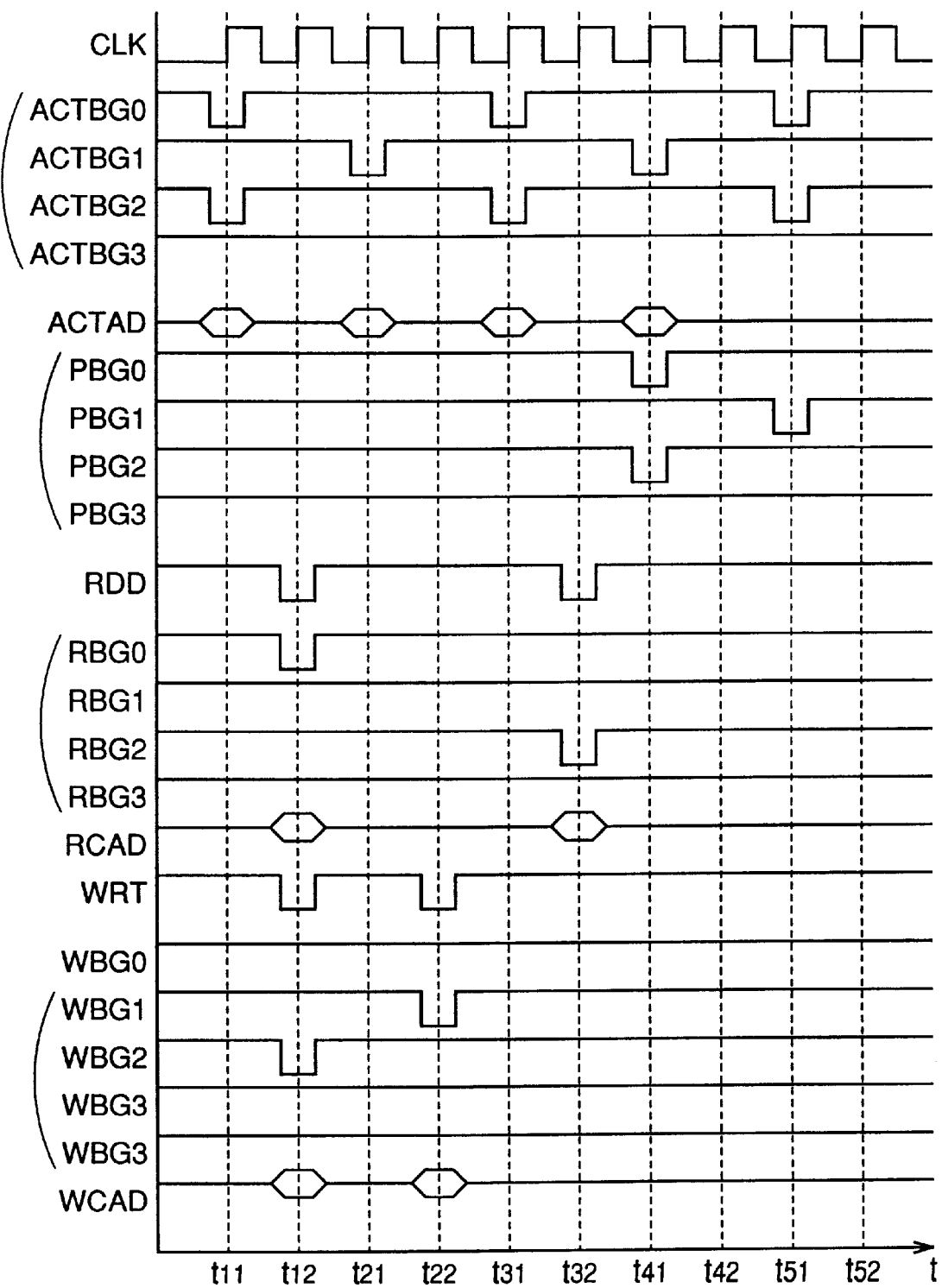
FIG. 9 is a timing chart showing a relationship between operation timing and timing of address section in a semiconductor memory device 1000.

FIG. 9 is a timing chart for showing a relationship between the operation timing and the address selection timing in semiconductor memory device 1000.

Referring to FIG. 9, one cycle of the operation of semiconductor memory device is formed of a row-related operation, in which the memory cell row corresponding to the address signal is selectively activated and the data in memory cell is read onto the bit line pair, and a column-related operation, in which the column selection is performed in response to the column address signal and the read/write data is transmitted between the corresponding bit line pair and the data line.

Referring to FIG. 9, the operation at times t11 and t12 correspond to the address selection in one cycle operation of semiconductor memory device 1000.

In semiconductor memory device 1000, large volumes of data are simultaneously handled in parallel so that a plurality of memory cell blocks, which are related to the same main word line, are handled as one bank group (which will also be referred to simply as "BG" hereinafter) and are commonly activated. More specifically, in the arrangement shown in FIG. 2, the four memory cell blocks which neighbor to each other in the row direction form the same bank group, and the normal memory cell array is divided into four bank groups BG0–BG3. By activating the memory cell blocks (banks) a bank group at a time as described above, all the I/O lines of n in number shown in FIG. 2 can be effectively used for performing input/output of the data.

At time t11 in FIG. 9, clock signal CLK rises, and control signals ACTBG0 and ACTBG2 become active to instruct activation of the row-related operation to BG0 and BG2, respectively. The row address signal corresponding to the above is applied so that corresponding internal address signal ACTAD is produced by the address driver.

At time t12 within the same cycle, read and write activating signals RDD and WRT are activated for performing the read and write operations. Further, read bank group activating signals RGB0–RGB3 and write bank group activating signals WGB0–WGB3 are selectively activated for designating the bank in which the read and write operations are to be executed. Further, the corresponding column address is applied, and the address driver produces corresponding internal address signals RCAD and WCAD. At this time, signals RBG0 and WBG2 are already active. In this first cycle, the read operation is executed on BG0, and the write operation is executed on BG2.

As already described with reference to FIG. 4, the data I/O line in the normal memory cell array is divided into the read data line and the write data line so that the read and write operations can be performed in parallel even within the same cycle, if these operations are performed for different banks, respectively.

A range after time t21 shows operation timing from second to fifth cycles.

For example, the write operation is effected on BG1 in the second cycle. For this, signal ACTBG1 is activated at time t21 so that the row-related operation is activated. Further, write control signal WRT and signal WBG1 are activated at time t22 so that write column address signal WCAD is taken in.

In the third cycle, the instruction of the read operation is issued for BG2. In the fourth cycle, the read and write operations are not instructed, but the row-related operation of BG1 is activated for performing refreshing and others. Also, precharge activating signals PBG0 and PBG2 are activated for precharging in BG0 and BG2, respectively.

In the fifth cycle, refreshing in BG0 and BG2 is instructed, and precharging in BG1 and BG3 is instructed.

In this manner, the address driver produces row address signal ACTAD and column address signals RCAD and WCAD based on the externally supplied control signal, if necessary, and the address bus transmits these signals to the memory cell array and the redundant control circuit. In response to the activation of the row- and column-related operations, these internal address signals are compared with the defective address stored in the defective address program circuit, and the redundant control circuit determines whether the redundant repair is necessary or not.

Structure of Redundant Control Circuit

Figure 10:
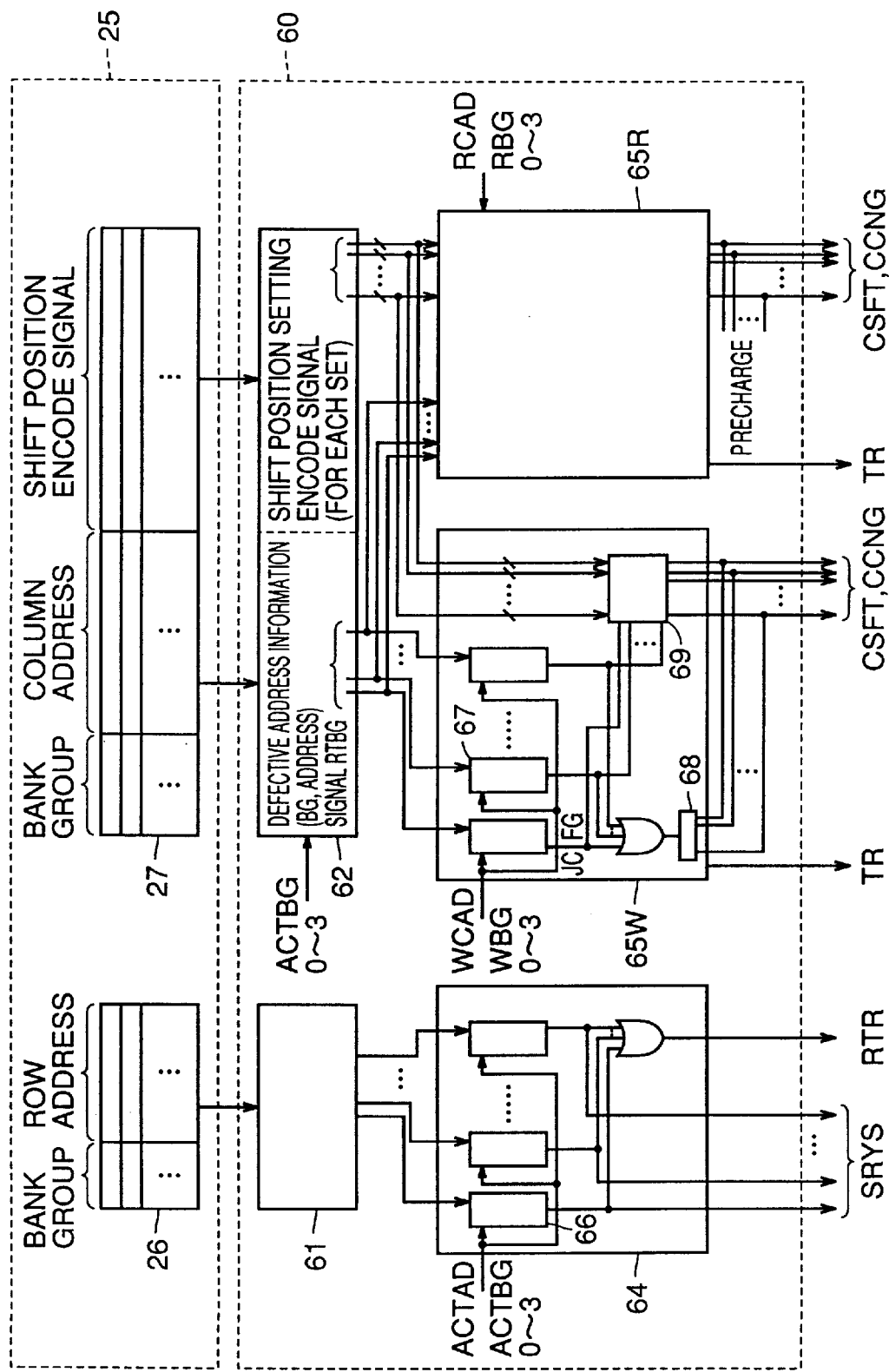
FIG. 10 is a block diagram showing a structure of a redundant control circuit 60.

FIG. 10 is a block diagram showing the structure of redundant control circuit 60.

Referring to FIG. 10, redundant address program 25 includes an address program circuit 26 for storing the defective address of the row, and an address program circuit 27 for storing defective address information of the column.

The information related to the defective address of the row (which will be referred to as "row defective address information" hereinafter) is formed of a bank group address and a row address for designating the row including the defective memory cell. The information relating to the defective address of the column (which will be referred to as "column defective address information" hereinafter) is formed of the bank group address and the column address for designating the column including the defective memory cell as well as the shift position encode signal which is data specifying the connection form in data line shift circuit 75 for executing the redundant repair.

Address program circuits 26 and 27 are provided with nonvolatile elements such as electric fuses for storing, in a nonvolatile manner, the defective address information supplied via defective address information input terminal group 15.

In accordance with the timing of, e.g., power-on, the row defective address information is transferred from defective address program circuit 25 to a redundant data latch circuit 61 in redundant control circuit 60. In accordance with the same timing, the column defective address information is transmitted to redundant data latch circuit 62 in redundant control circuit 60.

Redundant control circuit 60 includes row redundancy determining circuit 64 performing the redundancy determination for the row address, and column and row redundancy determining circuits 65W and 65R performing the redundancy determination for the column address.

Row redundancy determining circuit 64 has row redundancy determining sets 66 provided for the redundant rows, respectively. The defective row addresses (bank group addresses and row addresses) are transmitted to corresponding row redundancy determining sets 64, respectively. Row address signals ACTAD and ACTBG0–ACTBG3 which are supplied in accordance with the same timing as activation of the row-related operation are applied to the row redundancy determining sets, respectively.

For example, the row redundancy determining set in the ith (i: natural number) position related to redundant row SRi in the ith position compares the input row address signal with the defective row address, and activates signal SRYSi for activating redundant row SRi and thereby reading the data stored in the sense amplifier when the input row address signal matches with the defective row address, and thus the defective row of normal memory cells is to be repaired.

The redundant row activating signal SRYSi is transmitted via spare row read YS line SRYSRL and spare row write YS line SRYSWL shown in FIG. 5, whereby the sense amplifier circuit included in redundant row SRi is connected to the spare row read data line and spare row write data line.

Each row redundancy determining set compares the row address signal supplied thereto with the corresponding defective row address. Row redundancy determining circuit 64 obtains the logical OR between the outputs of the respective row redundancy determining units, and thereby issues a row redundancy determining signal for determining whether the row redundant repair is to be performed or not as a whole.

The row redundancy determining signal RTR is used as a determining signal for controlling switching between the normal read data line and the spare row read data line.

In the redundant row circuit, the storage data is directly stored by the sense amplifier circuit as already described with reference to FIG. 5, and the refreshing for holding the stored data is not necessary. Accordingly, the whole chip does not require the precharging when the redundant row is accessed. Therefore, the precharging may be stopped in the whole chip when redundancy determining signal RTR is activated, whereby it is possible to reduce the power consumption by stopping the unnecessary precharging for the normal memory cell array.

The column redundancy determining circuit is divided into column redundancy determining circuit 65W for writing and column redundancy determining circuit 65R for reading so that the reading and the writing can be executed simultaneously in the different bank groups within the same cycle. The column redundancy determining circuits 65R and 65W have column redundancy determining sets 67 each provided for one set of defective address information. Redundant determining set 67 for one set of defective address information is provided in each of column redundancy determining circuits 65R and 65W.

When the column-related operation is active, column address signals for the read operation, i.e., signals RCAD and RBG0–RBG3 are applied to respective column redundancy determining sets 67 included in column redundancy determining circuit 65R. Likewise, column address signals for the write operation, i.e., signals WCAD and WBG0–WBG3 are applied to respective column redundancy determining sets 67 included in column redundancy determining circuit 65W.

Each column redundancy determining set 67 compares the column address signals thus applied with the defective address (column) transferred by redundant data latch circuit 62, and can activate a flag JCFG instructing the column redundant repair.

The column-related redundant repair is not performed merely by replacement of the memory cell column unit, but by shift setting of the data lines.

The shift position encode signals corresponding to the respective defective column addresses are transmitted in a multiplexed manner from redundant data latch circuit 62 to a shift position setting signal transfer circuit 69.

Shift position setting signal transfer circuit 69 receives determination result flag JCFG of each column redundancy determining set 67. When one of flags JCFG is active, shift position setting signal transfer circuit 69 issues, as a data line shift control signal CSFT and a connection control signal CCNG, the shift position encode signal corresponding to the defective column address of the active column redundancy determining set. The connection form of the data lines is controlled in accordance with signals CSFT and CCNG as will be described later in greater detail.

When the column redundant repair is not necessary, and in other words, any one of flags JCFG issued from column redundancy determining sets 67 is not active, precharge circuit 68 precharges signals CSFT and CCNG to Vss level.

Further, column redundancy determining circuit 67 issues a signal TR for activating data line shift circuit 75 during the column-related operation.

The column-related redundancy determination is performed after the redundancy determination related to the row is performed in accordance with activation of the row-related operation. However, such a situation cannot occur that the bank group which was not activated during the row-related operation is activated during the column-related operation. Before the column-related redundancy determination, therefore, address latch circuit 62 performs comparison between the bank group activating signals ACTBG0–ACTBG3 during the row-related operation and the bank group address of the defective column address, and issues bank group matching signals RTBG.

Bank group match signals RTBG are transmitted to column redundancy determining sets, respectively, and thereby activates only the column redundancy determining set which is provided for the defective column address representing the matched bank group. In this manner, the column redundancy determination is actually performed. Thereby, only the required column redundancy determining set can be activated so that the power consumption can be reduced.

Figure 11:
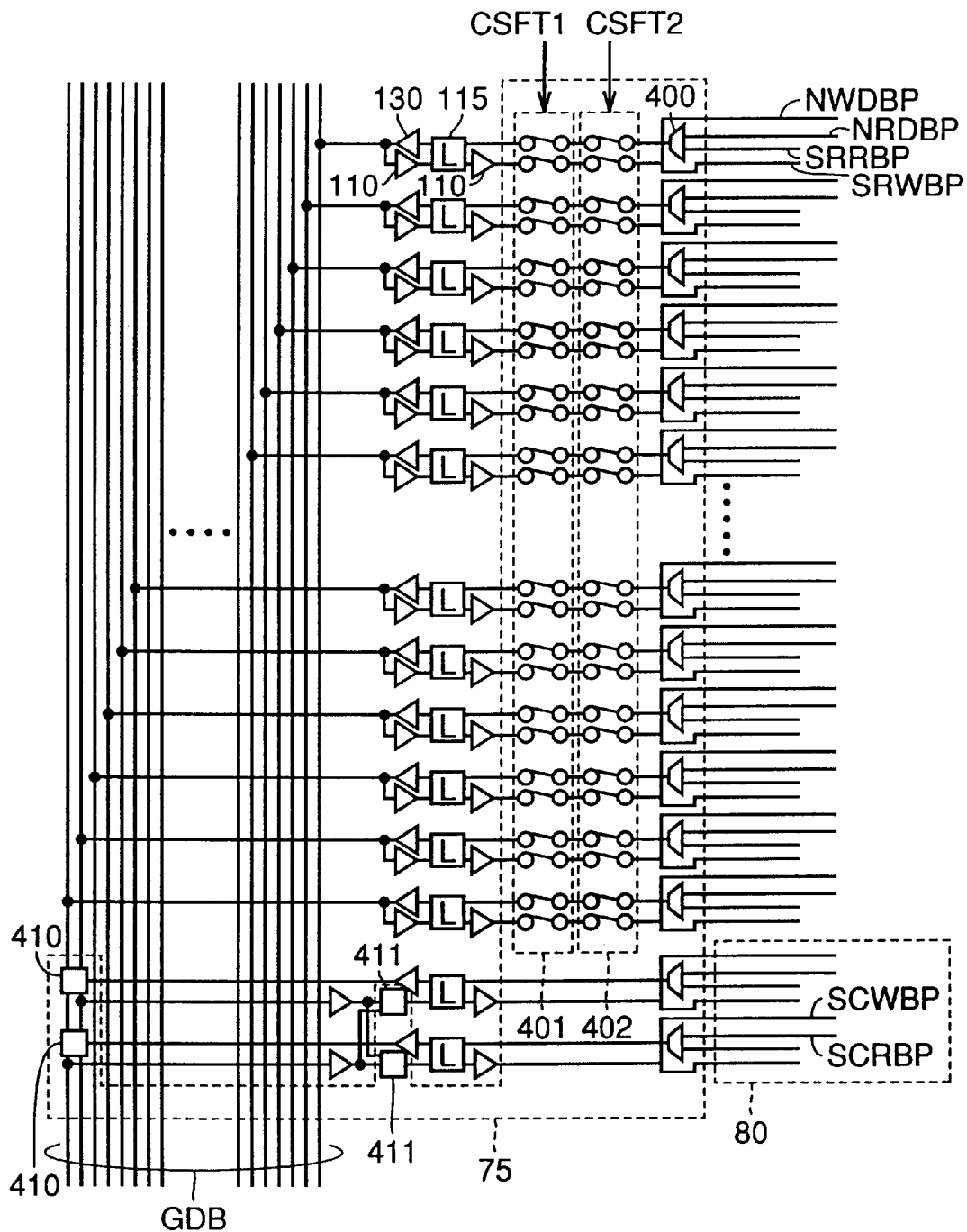
FIG. 11 conceptually shows a structure of a data line shift circuit 75.

FIG. 11 schematically shows a structure of data line shift circuit 75.

In connection with data line shift circuit 75 shown in FIG. 11, normal read data bus pair NRDB and /NRDB already described with reference to FIG. 4 is represented by one data line and is generally indicated by "NRDBP". Likewise, the normal write data bus pair is represented by one data line and is generally indicated by NWDBP. Spare row read data line pair SRRB and /SRRB is represented by one data line generally indicated by SRRBP. Spare row write data line pair is represented by one data line generally indicated by SRWBP. It is assumed that the column redundant circuit is provided with two sets of spare read data lines generally indicated by SCRBP1 and SCRBP2 as well as two sets of spare write data lines generally indicated by SCWBP1 and SCWBP2.

First, the row-related redundant repair operation will be described. In the data read operation, a multiplexer 400 in data line shift circuit 75 connects one of normal read data line pair NRDBP and spare row read data line pair SRRBP to the output node of multiplexer in accordance with the result of determination of the row redundancy determining circuit.

Figure 12:
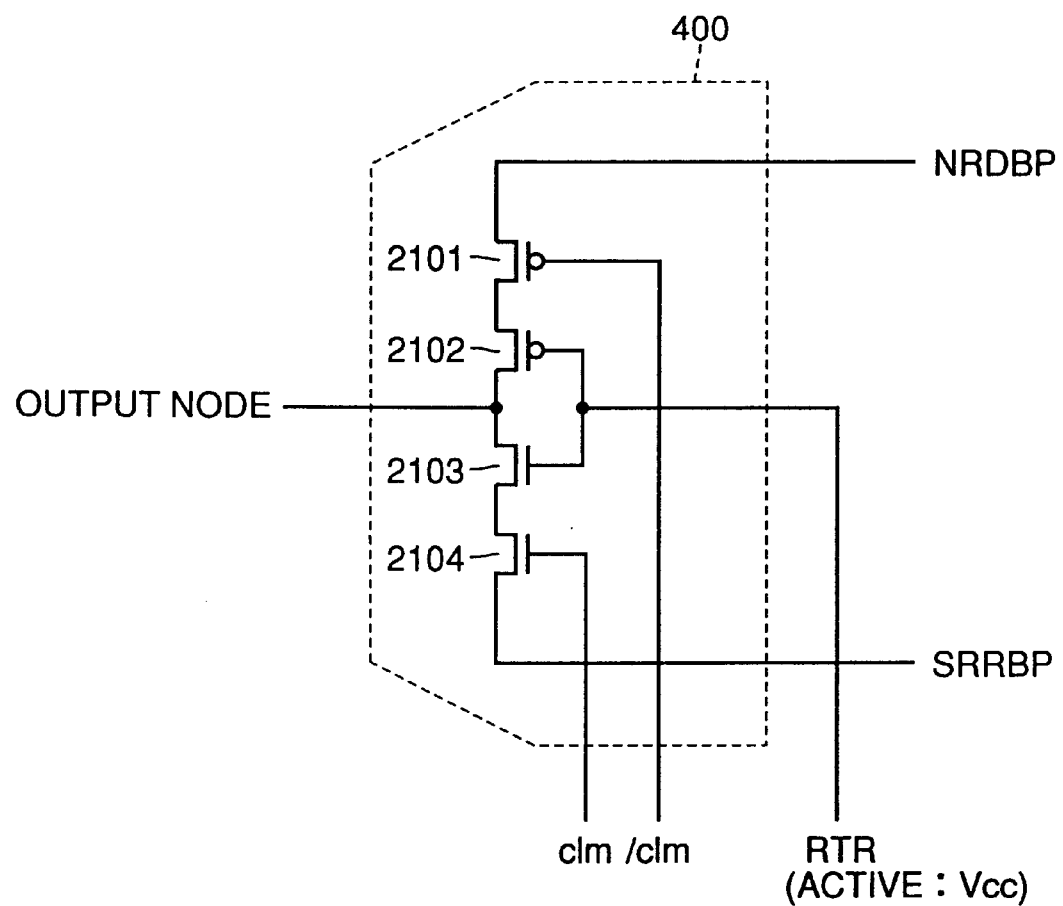
FIG. 12 is a circuit diagram showing a specific structure of a multiplexer.

FIG. 12 is a circuit diagram showing a specific structure of multiplexer 400. Referring to FIG. 12, multiplexer 400 includes an output node connected to a second shift circuit, transistors 2101 and 2102 connected between the output node and normal read data bus pair NRDBP, and transistors 2103 and 2104 connected between the output node and spare row read data line pair SRRBP.

Transistors 2101 and 2104 receive on their gates a signal clm, which is applied in the form of one-shot pulse at the start of the column-related operation, and an inverted signal/ clm thereof. Transistors 2102 and 2103 receive row redundancy determination signal RTR on their gates.

Row redundancy determination signal RTR is produced by row redundancy determining circuit 64 upon activation of the row-related operation, and will be latched until activation of the column-related operation. Row redundancy determination signal RTR thus latched is used for reading the data on spare row read data line pair SRRBP, when the redundant repairing of the defective row is to be performed.

Conversely, if the row redundant repair is not performed, normal read data line pair NRDBP for transmitting the data read from the normal memory cell array is connected to the output node of multiplexer.

Referring to FIG. 11 again, signal on one of normal read data line pair NRDBP and spare row read data line pair SRRBP is sent from the output of multiplexer depending on whether the row redundant repair is to be performed or not. This output is latched by data latch circuit 147 via the second and first shift circuits. Thereafter, the output is amplified by read amplifier 120, and is transmitted onto global data bus GDB. Through a series of operations thus performed, the appropriate data, which is selected depending on whether the row redundant repair is performed or not, is transmitted onto the global data bus via the data line shift circuit.

In the data write operation, write driver 110 and data latch circuit 115 transmit the data on global data bus GDB onto both data line pairs NWDBP and SRWBP via first and second shift circuits 401 and 402. Sub-YS line SYSL selects the connection between line pair NWDBP in the normal memory cell array and the sense amplifier, and spare row YS line SRYSL controls the connection between line pair SRIOP in the row redundant circuit and the sense amplifier circuit. Depending on whether the row redundant repair is to be performed or not, only one of the spare row YS line and the sub-YS line is activated, and both the lines are not simultaneously activated. Therefore, the write data is appropriately stored in the normal memory cell array or the row redundant circuit depending on whether the row redundant repair is to be performed or not.

The column-related redundant repair operation will now be described. Transmission of data in the spare column region is performed similarly to that in the normal memory cell array. More specifically, the data passed through multiplexer 400 is transmitted onto global data bus GDB via data latch circuit 145, write driver 110 and read amplifier 120. However, line pairs SCRBP1 and SCWBP1 are connected to selected two line pairs in global data bus GDBP, and line pairs SCRBP2 and SCWBP2 are also connected to selected two line pairs in global data bus GDBP. More specifically, the data on the two line pairs of global data bus GDB, which are connected to connection switch circuits 410 and 411, respectively, can be transmitted to either SRDBP1 or SRDBP2 in the read operation. In the write operation, the write data which is transmitted by SWDBP1 and SWDBP2 can be transmitted to either the two global data bus pairs connected to connection switch circuit 411. In the first and second shift circuits, the shift setting for the read data line is determined independently of the shift setting for the write data line so that the read operation and the write operation can be simultaneously executed in the different and therefore multiple bank groups in the same operation cycle.

Description will now be given on the shift operation for the data lines in the case where the defective memory cell is actually present.

Figure 13:
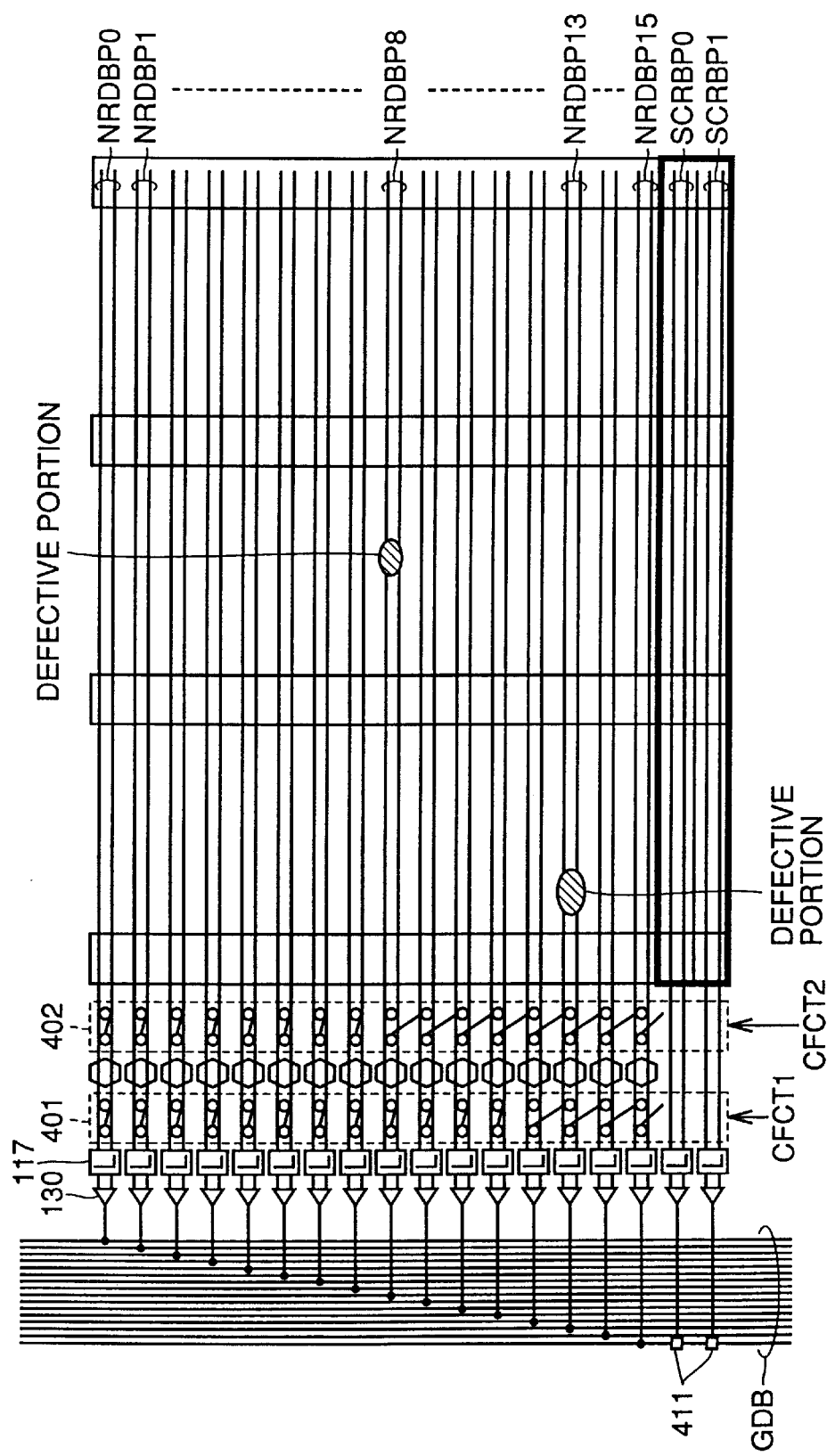
FIG. 13 conceptually shows a shift operation for column redundant repair in a read operation.

FIG. 13 conceptually shows the column redundant repair shift operation in the read operation.

Referring to FIG. 13, first and second shift circuits 401 and 402 connect the normal read data line pair to the global data bus without shifting the normal read data line pair in the normal operation. When defective memory cells are present as represented by hatched circles in the figure, the operation is performed to interrupt the path between the normal read data line pair corresponding the defective portion and the global data line. More specifically, since the defective is present in portion corresponding to NRDBP8, the second shift circuit shifts each of normal read data line pairs including and succeeding NRDBP9 by one so that NRDBP9 may be connected to the global data bus which was originally to be related to NRDBP8.

Since the defect is also present in the portion corresponding to NRDBP13, shifting is performed in a similar manner for interrupting connection between this normal read data line pair and the global data bus. This shifting or switching is executed by the first shift circuit, and more specifically, the first shift circuit shifts NRDBP14 and NRDBP15 upward by one from the original positions related to the global data bus.

When the first and second shift circuits operate as described above, NRDBP1–NRDBP7 transmit the read data onto the global data buses to be originally related, but the data on NRDBP8 is not read onto the global data bus pair.

The data on NRDBP9–NRDBP12 are read onto the global data bus pairs shifted by one from those to be originally related. The data on NRDBP13 is not read onto the global data bus pair. The data on NRDBP14 and NRDBP15 are read onto the global data bus pairs which are shifted by two from the global data bus pairs to be originally related, and were originally related to NRDBP12 and NRDBP13.

As a result of the above shift operation, the data on the normal read data line pair corresponding to the defective portion is not read onto the global data bus pair. The defective portions are repaired by the column redundant circuit, and the corresponding data are read onto spare read data line pairs SCRBP1 and SCRBP2. Connection between the data line of the column redundant circuit and the global data bus is established by connection switch circuit 411 without interposing the shift circuit therebetween.

In the above manner, the global data bus, which does not carry the read data due shifting of the normal read data line, is supplied with the read data stored in the column redundant circuit. The series of operations described above can perform the column-related redundant repair.

The shift form or manner of the first and second shift circuits is instructed by a data line shift control signal CFCT which is the output of column redundancy determining circuit.

The shift setting for the data lines is appropriately determined for each defective column address. The shift information affects control signal CFCT which is issued from the column redundancy determining circuit for each defective column address, whereby the shift setting of the first and second shift circuits can be dynamically changed.

This provides a remarkable advantage compared with a conventional manner, in which the instruction of the shift operation is directly controlled by nonvolatile information such as electric fuses. Since replacement of the defective portion can be performed bank by bank or bank group by bank group during the multi-bank operation, the same column redundant circuit can be commonly used by the plurality of memory cell blocks so that the repairing efficiency can be improved.

In the structure described above, since the redundant repair is not performed at column address of the memory cell at a time, but is performed a data line at a time, the column-related repairing operation can be efficiently performed in the structure provided with a large number of I/O data lines.

In FIGS. 11 and 13, the spare redundant circuit is provided with two data I/O line pairs, and the shift circuits are two in number. However, the invention is not restricted to this. The data line pairs in the column redundant circuit may be increased in number, and the shift circuits may be correspondingly increased in number so that repairing of more defectives can be performed.

Figure 14:
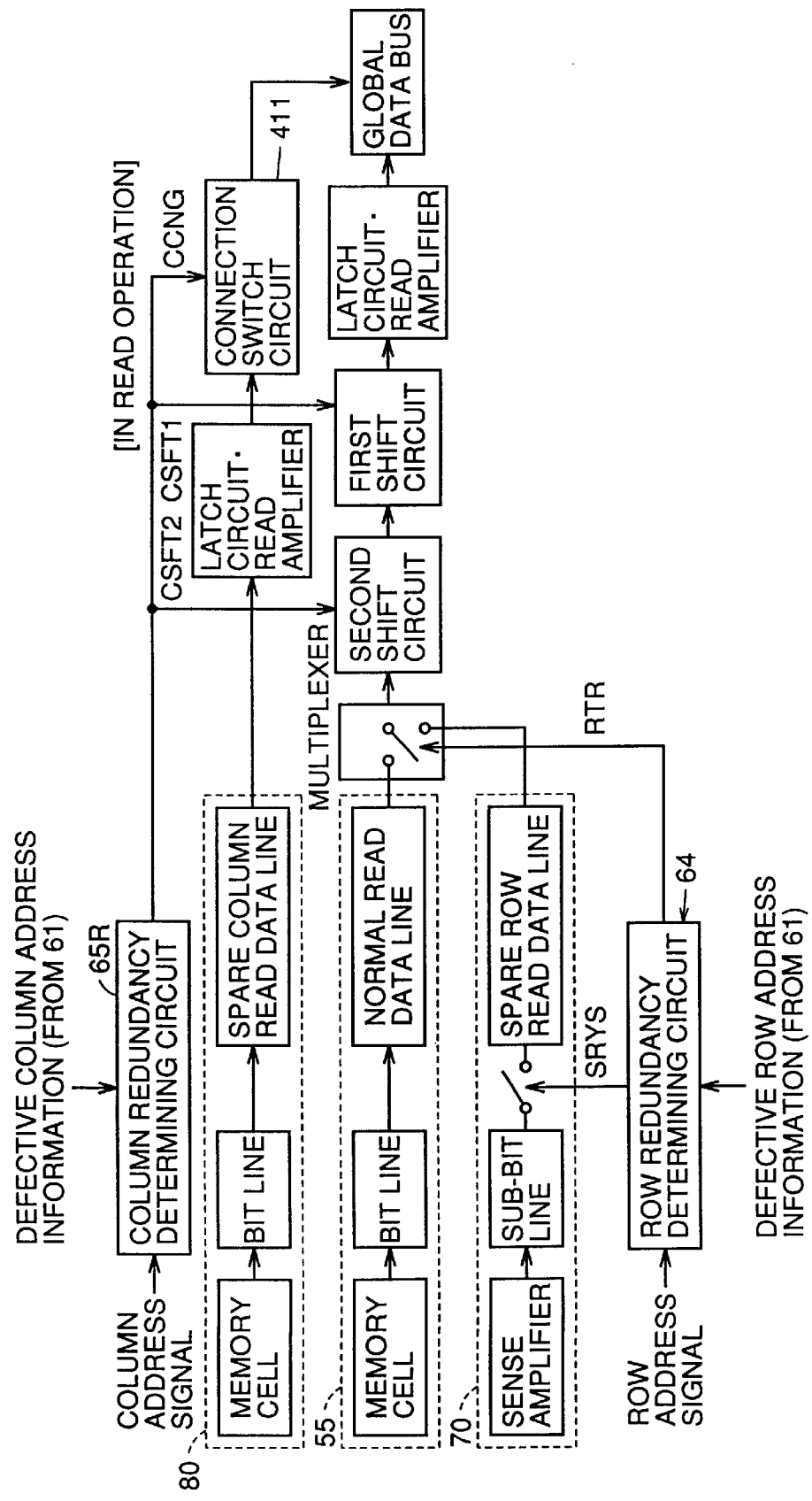
FIG. 14 is a block diagram showing flow of data in the read operation.

FIG. 14 is a block diagram showing data flow in various portions in the data read operation already described with reference to FIG. 13.

In memory cell block 55 in the normal memory cell array shown in FIG. 14, the data of memory cell is read in accordance with the activation of the row-related operation, and is further transmitted onto the normal read data line in accordance with the activation of sub-YS line SYSL. In row redundant circuit 70, the storage data latched in the sense amplifier is read onto the spare row read data line via the sub-bit line when the activation of redundant row is instructed in the row redundancy determining circuit.

The data on normal read data line and the data on spare row read data line are sent to multiplexer, and one of them is issued from multiplexer in accordance with row redundancy determination signal RTR. In column redundant circuit 80, the data of memory cell is read onto the bit lines in response to activation of the row-related operation, and then is read onto the spare column read data line in response to activation of spare sub-YS line SCYSL.

The column redundancy determining circuit makes a comparison between the column address signal and the defective column address. If the column redundant repair is required, corresponding data line shift control signals SCFT1 and SCFT2 are produced and applied to the first and second shift circuits, respectively.

The first and second shift circuits perform the shift operation based on control signal CFCT so that the read data line including the defect may not be connected to the data bus. After the required shift operation is completed, the read data is transmitted onto the data bus via the data latch circuit and the read amplifier.

The global data bus, of which correspondence with the normal read data line is released by the shift operation, is brought into correspondence with the spare column read data line by a connection switch circuit 141, which is controlled by control signal CCNG issued from the column redundancy determining circuit, and thereby can transmit the data which was stored in the column redundant circuit via the data latch circuit and the read amplifier. Through a series of operations described above, the column redundant repair is performed in the data read operation.

Figure 15:
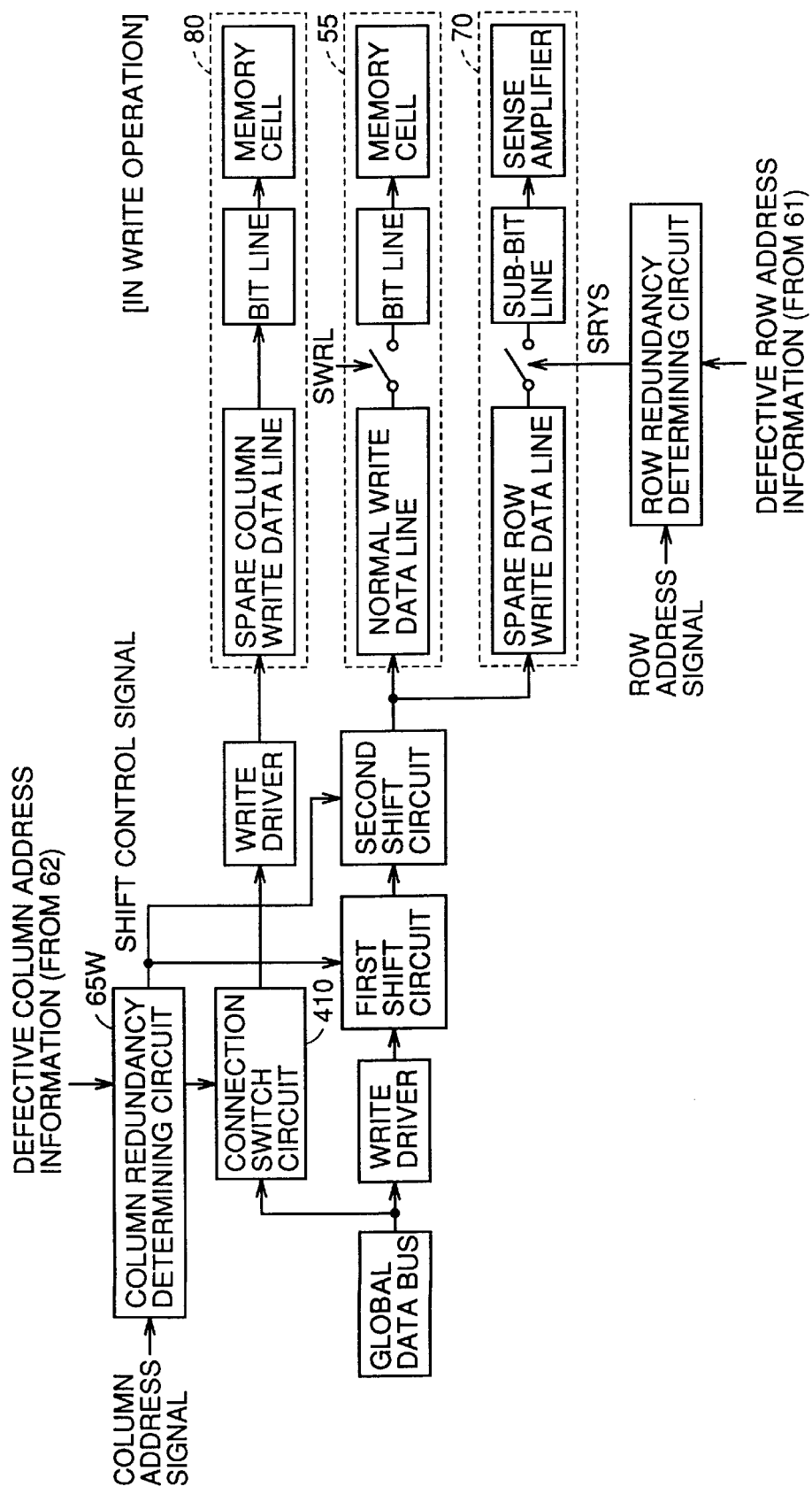
FIG. 15 is a block diagram showing flow of data in a write operation.

FIG. 15 is a block diagram showing flow of data in the write operation.

Referring to FIG. 15, the write data is transmitted from the global data bus to the normal write data line and the spare row write data line via the write driver and the first and second shift circuits 401 and 402.

When the shift control is performed in the first and second shift circuits in accordance with the result of column redundancy determination, the connection switch circuit changes the connection form based on control signal CCNG so that the write data may be stored on the spared column write data line instead of the normal write data line corresponding to the defective portion. Thereby, the write data is sent from the write driver through the spare column write data line and the bit line, and is stored in the memory cell.

In connection with the row redundant repair, the multiplexer do not perform the selection in the write operation, and the write driver drives the write data to both the normal write data line and the spare row read data line. The data written onto the normal write data line and the spare row read data line are selectively stored in the memory cell or the sense amplifier via the corresponding bit lines in accordance with the sub-YS signal and the spare sub-YS signal. If it is determined that the row redundant repair is to be performed as a result of the row redundancy determination, the corresponding spare sub-YS line is activated, and the sub-YS signal is not activated in the normal memory cell array. Therefore, the data is stored in the redundant row in the row redundant circuit.

When it is determined that the row redundant repair is not necessary, the spare sub-YS signal is not activated, and the sub-YS signal is activated in accordance with the corresponding address signal. Therefore, the write data is transmitted to and stored in the memory cell via the bit lines in accordance with the activation of the corresponding sub-write activating signal SWRL.

Second Embodiment

The second embodiment relates to a specific structure of the data shift circuit, and also relates to a specific structure for dynamic execution of the shift control of the data line in the column redundant repairing operation. First and second shift circuits 401 and 402 shown in FIG. 11 have the same structure, and therefore will be generally referred to as the "shift circuits" hereinafter.

Figure 16:
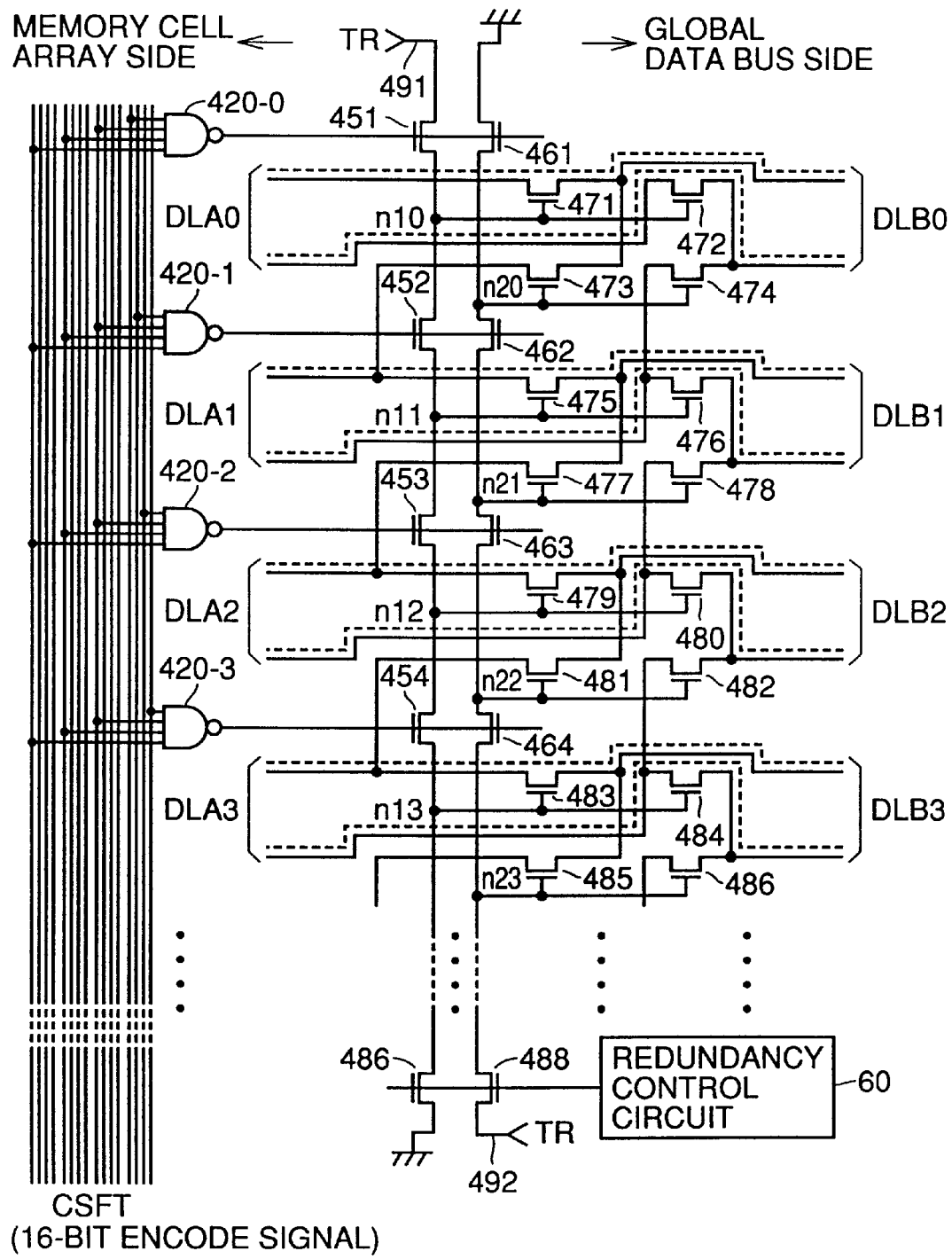
FIG. 16 is a circuit diagram showing a specific structure of a shift circuit.

FIG. 16 is a circuit diagram showing a specific structure of the shift circuit.

FIG. 16 shows a structure for shift control between only four complementary data line pairs DLA0–DLA3 arranged on the memory cell array side and four complementary data line pairs DLB0–DLB3 arranged on the global data bus side, for simplicity of description. Also, it is assumed that all the transistors used for connection are formed of N-channel MOS transistors. The shift control signals are generally indicated by "CSFT". Signal SCFT is a 16-bit encode signal.

Referring to FIG. 16, the shift circuit includes an interconnection 491, which is supplied with a current when a transistor 486 is turned on in accordance with activation (Vcc level) of shift circuit activating signal TR issued by redundant control circuit 60. The shift circuit also includes an interconnection 492, which is supplied with a current when a transistor 488 is turned on in a similar manner.

Transistors 451–454 connected in series are arranged on interconnection 491 and between power supply potential Vcc and ground potential Vss. Likewise, transistors 461–464 connected in series are arranged on interconnection 492 and between power supply potential Vcc and ground potential Vss.

Transistors 451 and 461 receive on their gates an output signal of a decoder 420-0. Decoder 420-0 receives data line shift control signal CFCT, which is an encode signal for specifying the shift position, and is represented by 16-bit information in this embodiment. Decoder 420-0 decodes the received signal by performing the NAND operation on the same. Transistors 452 and 462 receive the output signal of corresponding decoder 420-1 on their gates. Paired transistors 453 and 463 as well as paired transistors 454 and 464 are supplied with outputs of the corresponding decode circuits. When the control signal CFCT is formed of 16 bits as described above, 256 shift positions can be selectively specified as a whole.

Control signal CSFT is at the precharged level of ground potential GND during the normal operation, i.e., when the shift control is not instructed. In the normal operation, i.e., when the shift control is not instructed, the output of each decoder is at power supply potential Vcc level. Thereby, all transistors 451–454 and 461–464 are on so that nodes n10–n13 carry the potentials at Vcc level, and nodes n20–n23 carry the potentials at Vss level in the normal operation.

Data line pairs DLA0 and DLB0 are connected via transistors 471 and 472. Transistors 471 and 472 receive on their gates the potential on node n10. In the normal operation, transistors 471 and 472 are turned on so that data line pairs DLA0 and DLB0 are connected together. Further, data line DLA1 can be connected to data line pair DLB0 via transistors 473 and 474. In the normal operation, however, transistors 473 and 474 are off because node n20 is at ground potential GND level.

Similar connection forms are employed for the other data line pairs. In the normal operation, the complementary data line pairs are related and connected without shifting. In FIG. 16, connection paths are depicted by dotted lines.

Description will now be given on the operation which is performed when signal CSFT changes the output of decode circuit 450-2 to Vss level.

Figure 17:
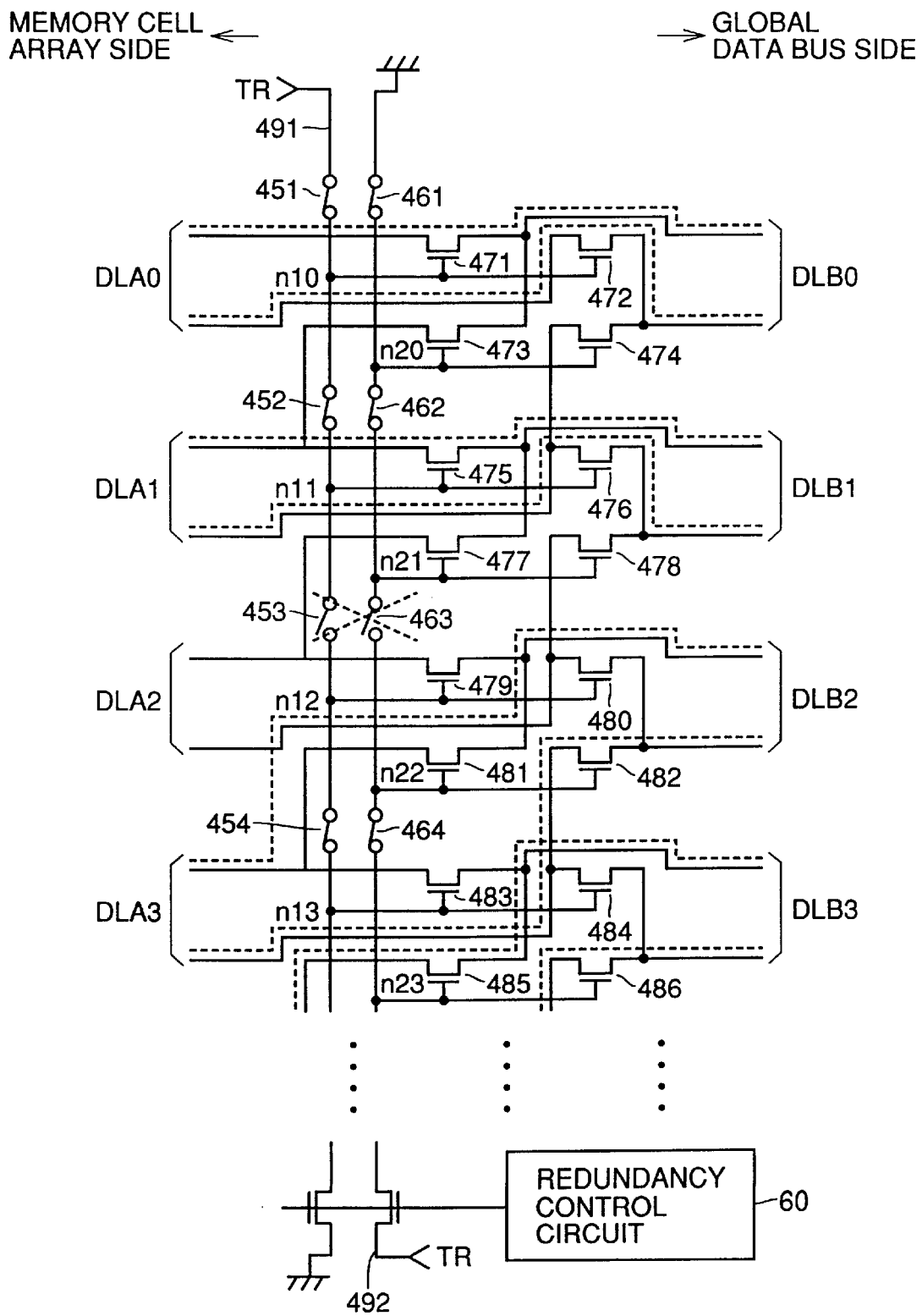
FIG. 17 is a circuit diagram showing an operation performed by the shift circuit shown in FIG. 16 when the shift operation is instructed.

FIG. 17 is a circuit diagram showing the operation of the shift circuits in the case where the shift operation is instructed.

In FIG. 17, transistors 451–454 and 461–464 are depicted simply in the form of switch.

Referring to FIG. 17, the output of decode circuit 420-2 turns off the switches corresponding to transistors 453 and 463. Thereby, the potentials on nodes n10 and nil are maintained at Vcc level, and switch 453 sets the potentials on nodes n12 and n13 to Vss level. Likewise, the potentials on nodes n20 and n21 are at the Vss level (i.e., the same level as that in the normal operation), but switch 463 changes the potentials on nodes n22 and n23 to Vcc level.

In response to the change in potential on the internal nodes, transistors 479 and 480 which have been on are turned off so that complementary data line pair DLA2 is no longer connected to any one of complementary data line pairs DLB1–DLB3 on the right side. Transistors 481 and 482 which were off during the normal operation are turned on so that data line pair DLA3 is connected to data line pair DLB2.

Likewise, data line DLA3 and the succeeding data lines are shifted upward by one. For example, line DLB3 which was connected to line DLA3 is connected to line DLA4 (not shown).

In this manner, the transistor which is designated by the output of decode circuit is turned off, whereby it is possible to provide on the opposite sides of this transistor, which is designated and turned off, a region where the connection form in the normal state is maintained and a region where the data lines are shifted upward by one for connection, respectively.

By employing the above shift setting, the first and second shift circuits can perform the shift operation corresponding to the defective portion as already described with reference to FIG. 13.

Figure 18:
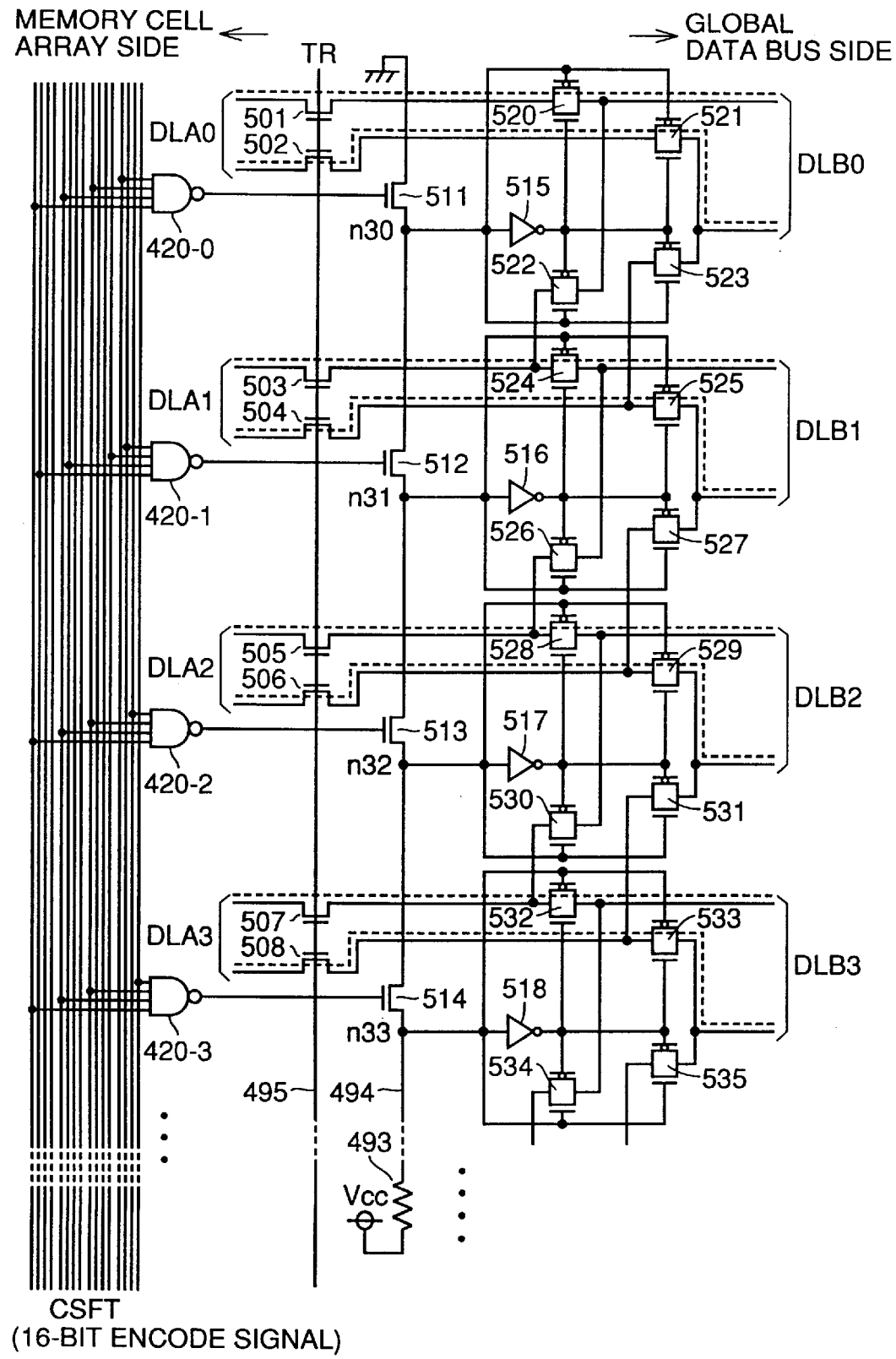
FIG. 18 is a circuit diagram showing another specific example of the structure of the shift circuit.

FIG. 18 is a circuit diagram showing another specific structure of the shift circuit.

The shift circuit shown in FIG. 18 differs from the shift circuit in FIG. 16 in that the shift circuit in FIG. 18 employs a pair of N- and P-channel MOS transistors as the transfer gate for connecting the data line pairs together, and thereby the transistors which control the shift form in accordance with the output of decode circuit 420 are arranged in one column.

Further, the current supply to interconnections 491 and 492 is not performed by the redundant control circuit, but the current restriction is performed merely by arrangement of the resistance elements. The transfer gate for connecting the data lines together has a CMOS structure, whereby the resistance of the data lines is reduced.

Referring to FIG. 18, transistors 501 and 502 as well as transfer gates 520 and 521 are arranged between data line pairs DLA0 and DLB0. Transistors 501 and 502 receive shift circuit activating signal TR on their gates, and are turned on in accordance with activation of the shift circuit. On/off of transfer gates 520 and 521 are controlled in accordance with the potential on node n30.

The potential on node n30 changes in accordance with on/off of a transistor 511. Similarly to the operation in FIG. 16, the output of each decode circuit is at Vcc level, and all transistors 511–514 are off in the normal state where the shift operation for the column redundant repair is not necessary. Thereby, all nodes n30–n33 are at Vss level. In the normal state, therefore, data lines DLA0–DLB0 are connected together. Connections between data lines DLA1–DLA3 and data lines DLB1–DLB3 are made in a similar form, and therefore description will not be repeated in detail. These data lines are likewise related to each other without being shifted during the normal operation. Dotted lines in FIG. 17 represent the connection paths.

Figure 19:
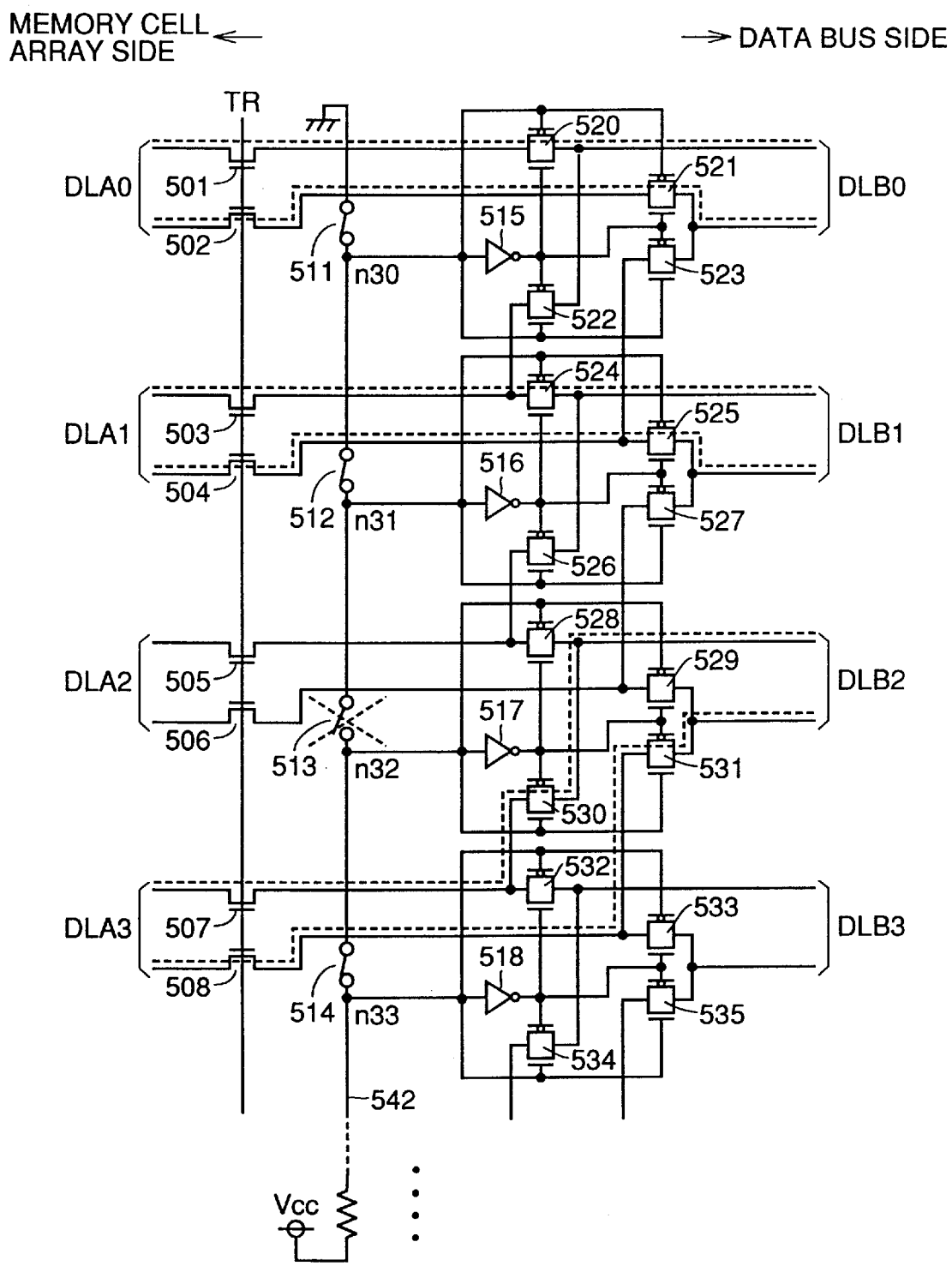
FIG. 19 is a circuit diagram showing an operation performed by the shift circuit in FIG. 18 when the shift operation is instructed.

FIG. 19 is a circuit diagram showing the operation which is performed by the shift circuit in FIG. 18 when the shift operation is instructed.

In FIG. 19, the output of decode circuit 420-2 changes from Vcc level to Vss level in accordance with the instruction of control signal CSFT. Thereby, transistor 513 changes from the on state to the off state, and the potentials on internal nodes n32 and n33 change from Vss level to Vcc level.

Thereby, transfer gates 528 and 529 which have been on are turned off, and transfer gates 530 and 531 in the off state are turned on. Similarly to the case in FIG. 17, data line DLA2 is not connected to any one of data lines DLB0–DLB3, and the data lines including and succeeding the line DLA3 are shifted upward by one, and are connected to the data lines including and following the line DLB2.

Another specific structure of the decode circuit will now be described below.

Figure 20:
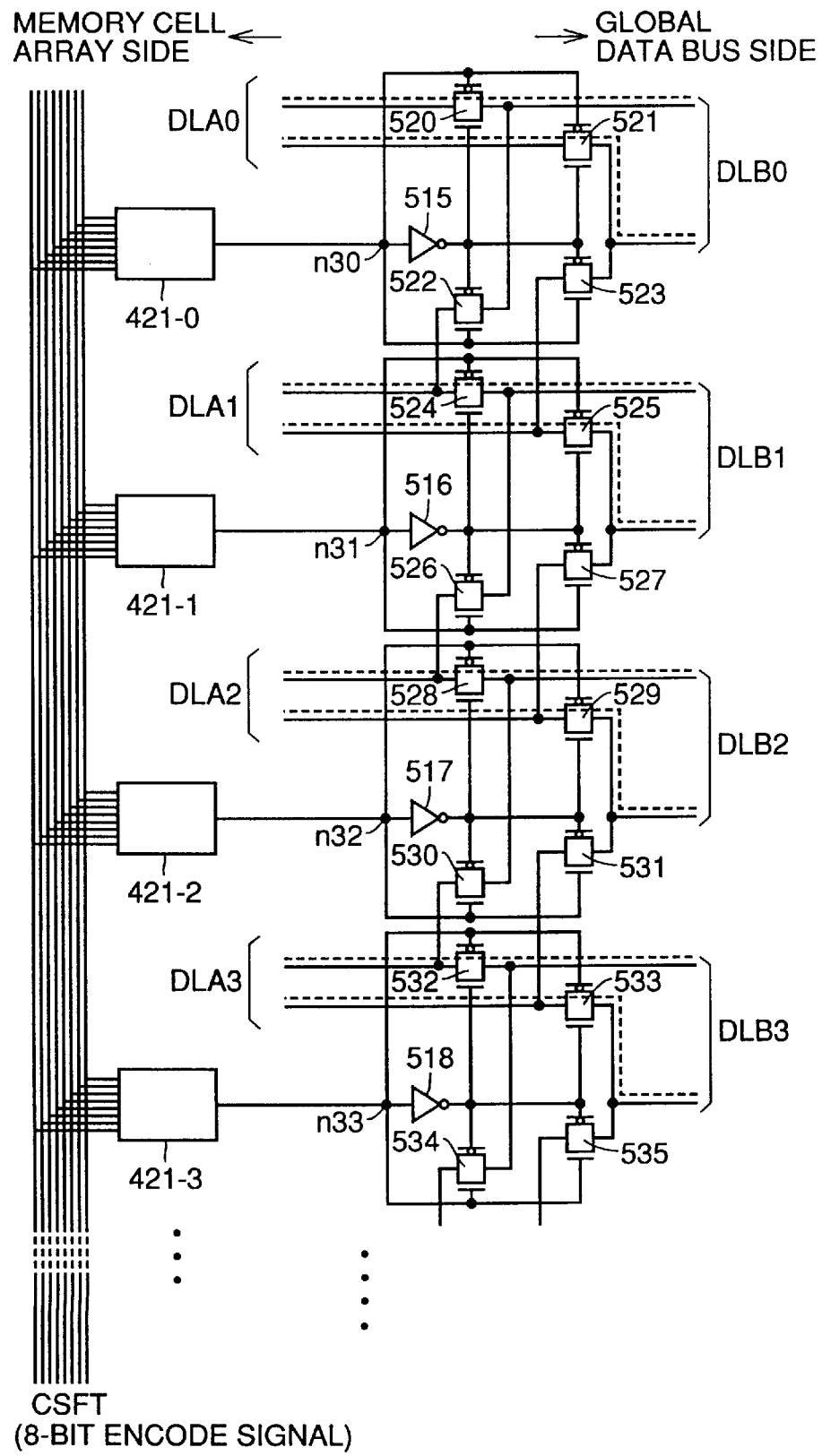
FIG. 20 is a circuit diagram showing a structure of the shift circuit using a decode circuit 421.

FIG. 20 is a circuit diagram showing a structure of the shift circuit provided with a decode circuit 421.

Referring to FIG. 20, shift setting signal CSFT is formed of, e.g., eight bits, and decode circuit 421 receive all the eight bits of signal CSFT. Decode circuit 420 which is already described is formed of an NAND operation gate receiving some of the bits of control signal CSFT on its inputs, and can decode the shift values at 256 positions in total by changing combinations of four bits of the supplied signal.

Decode circuit 421 utilizes the fact that control shift signal CSFT is a signal produced for designating one shift position, and converts combinations of the 8-bit signals of control signal CSFT into quantitative data. Thereby, decode circuit 421 issues the decode signal based on the result of comparison in magnitude between the data and the predetermined reference value which is set for each decode circuit.

The shift circuit using decode circuit 421 differs from the shift circuit using decode circuit 420 in FIG. 18 in that the output of the decode circuit can directly control the potentials on nodes n30–n33. Owing to this, it is not necessary to provide transistors 501–508 and 511–513, which are arranged between the power supply line and nodes n30–n33 in the shift circuit shown in FIG. 18, so that the circuit elements can be reduced in number, and the shift setting operation can be increased in speed.

Figure 21:
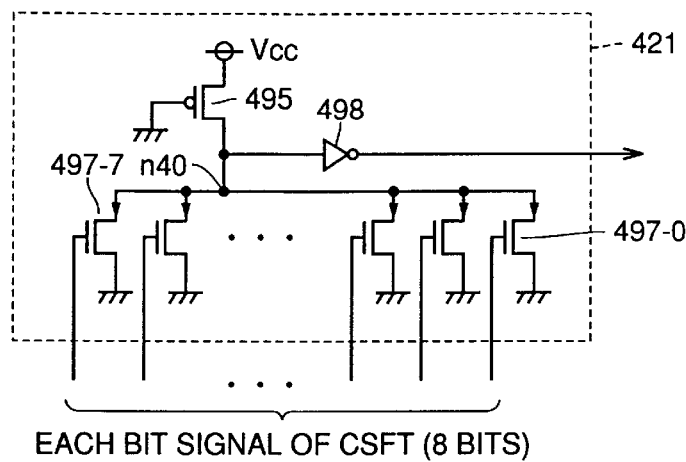
FIG. 21 is a circuit diagram showing a specific structure of decode circuit 421.

FIG. 21 is a circuit diagram showing an example of a specific structure of decode circuit 421.

Referring to FIG. 21, decode circuit 421 includes a P-channel MOS transistor 495, which is connected between power supply potential Vcc and an intermediate node n40, as well as eight transistors 497-0–497-7 which are connected in parallel between intermediate node n40 and ground potential GND. Transistors 497-0–497-7 are supplied on their gates with corresponding bit signals of control signal CSFT, respectively. Transistor 495 is provided for supplying a constant current from power supply potential Vcc to intermediate node n40. The predetermined current supplied by transistor 495 is set by each decode circuit to a predetermined value different from the other values, and this predetermined value corresponds to the reference value for comparison in magnitude.

Transistors 497-0–497-7 have current drivability which are determined such that the current drive power in the Kth position (K: 0–7) takes on the value of $2^k \cdot it$ (it: drive current of transistor 497-0).

Thereby, the total current flowing from node n40 toward the ground potential depends on the decoded value of control signal CSFT of 8 bits. More specifically, the potential on node n40 depends on the result of comparison between the predetermined current value supplied to node n40 by transistor 495 and the current flowing from node n40 toward the ground potential. The output of an inverter 498 inverting the above state, i.e., the decode signal of decode circuit 421 is at potential Vcc level in a certain region, and is at Vss level in the other region which is separated from the above certain region by the designated shift position.

Third Embodiment

According to the semiconductor memory device of the invention, as already described with reference to FIGS. 14 and 15, the data access path in the read operation is different from that in the write operation, and therefore the timing requiring completion of the shift setting in the first shift circuit is different from that in the second shift circuits.

In the read operation, it is merely required that the setting of shift is completed before the data read from the memory cell array reaches the shift portion via the data line, and therefore the timing margin is relatively large. In the write operation, however, the externally supplied write data reaches relatively fast to the first and second shift circuits via the global data bus, and therefore the timing margin before completion of the shift setting is small in the write operation.

As already described with reference to FIG. 10, redundant control circuit 60 has a structure that the read column redundancy determining circuit 65R for issuing the shift set signal to the shift circuit, which is used in the read operation, is separated from write column redundancy determining circuit 65W for issuing the shift set signal to the shift circuit, which is used in the column operation. Only by the above structure, even when the read operation and the write operation are, e.g., activated alternately, the setting control of the global data bus and the shift circuit for the write data is performed via a path different from that for the read data, and the operation margin can be large.

The third embodiment provides a structure of the column redundancy determining circuit, which can deal with more flexibly the above difference in timing margin.

Figure 22:
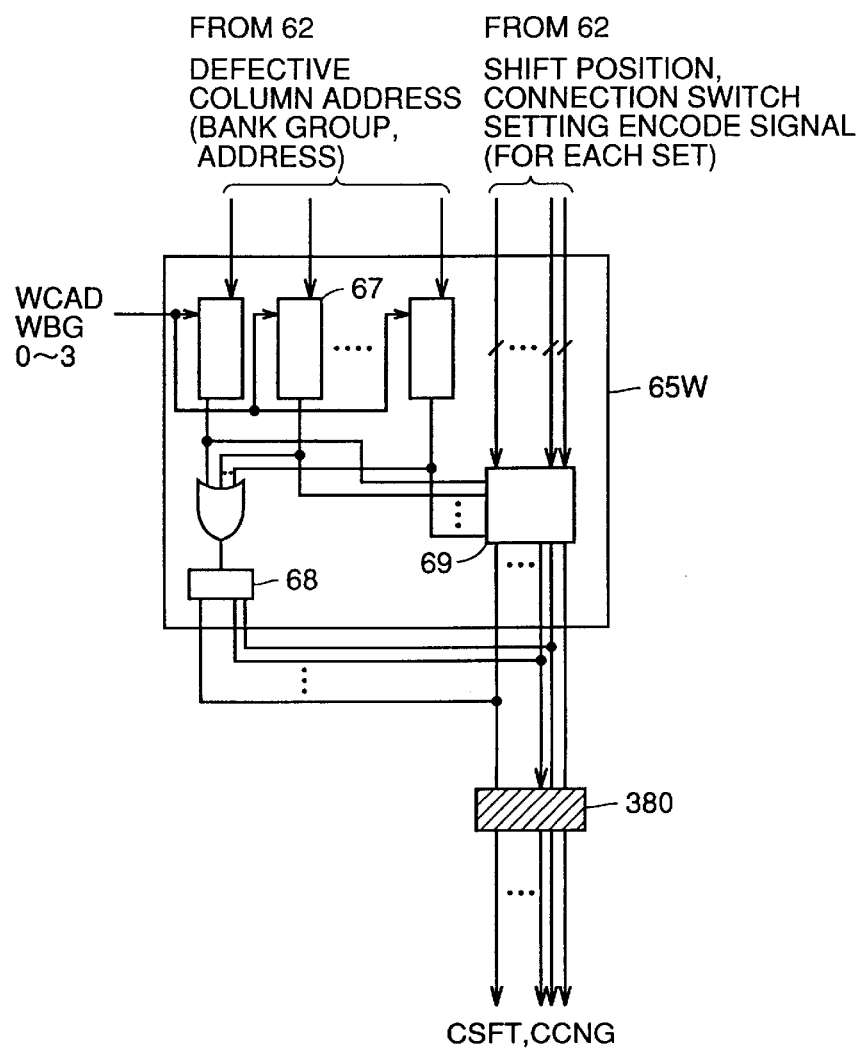
FIG. 22 is a block diagram showing a structure of a column redundancy determining circuit 365W in a third embodiment.

FIG. 22 is a block diagram showing a structure of a column redundancy determining circuit 365W of the third embodiment 3 of the invention.

Referring to FIG. 22, column redundancy determining circuit 365W includes a latch circuit 380 in addition to the structures in column redundancy determining circuit 65W shown in FIG. 10.

Latch circuit 380 can latch data line shift control signal CSFT and signal CCNG issued from column redundancy determining circuit 365W, and can shift the timing of them by one clock cycle, e.g., by a D-flip-flop.

Figure 23:
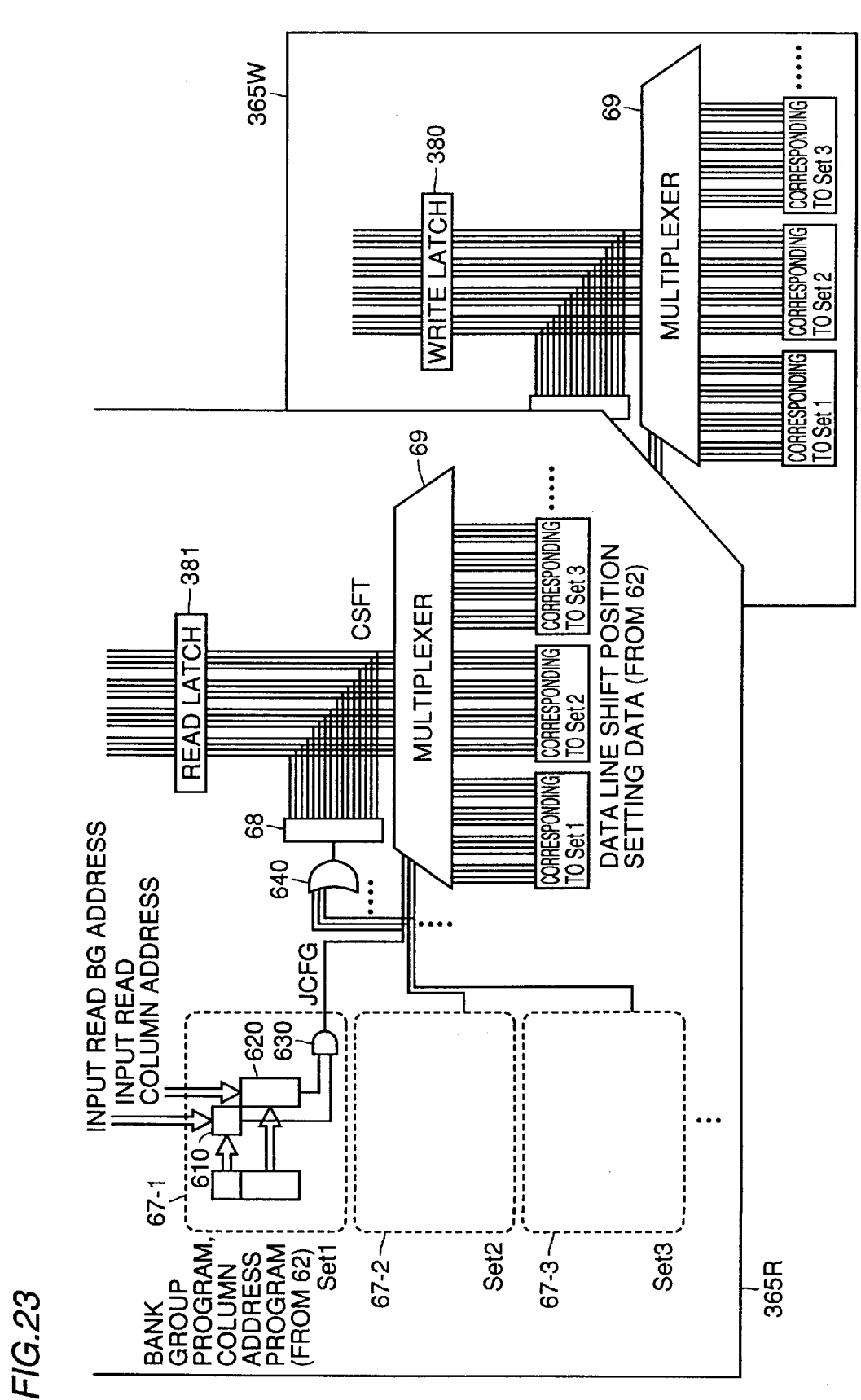
FIG. 23 is a block diagram showing more specifically production of a signal CSFT designating a shift set position of redundancy in column redundancy determining circuits 365R and 365W.

FIG. 23 is a block diagram showing more specifically the production of decode signal CSFT, which designates the shift set position of redundancy in the column redundancy determining circuit. As already described, column redundancy determining circuits 365W and 365R execute the address comparison and determination as well as production of the shift control signal independently of each other.

Referring to FIG. 23, the defective column address (bank group and column) which is stored in address program circuit in a nonvolatile manner as well as information which represents the shift position of the corresponding data line at the time of address input are latched by redundant data latch circuit 62, and then are applied to the corresponding column redundancy determining sets 67-1, 67-2, . . . and 67-p (p: predetermined natural number).

When the input column address signal matches with the defective column address, precharge circuit 68 releases the precharged state of the output node (at the precharged L-level of ground potential Vss) of multiplexer 69 in accordance with an output of an OR circuit 640 receiving the outputs of redundancy determining sets 67-1–67-p. Also, data line shift control signal CSFT representing the switch position of the data line is issued via multiplexer 69. This decode signal is latched in advance by redundant data latch circuit 62 corresponding to the defective column address.

The decode signal issued from multiplexer 69 is temporarily held in write latch circuit 380 and read latch circuit 381.

These latch circuits are required in connection with the timing for taking in the address signal because it is impossible to discriminate between the read and write operations in the address determining period if such a mode is employed that reading of the address signal precedes reading of the command signal by one clock cycle. In the read operation, read latch circuit 381 shifts the decode signal by one clock cycle. In this mode during the write operation, write latch circuit 380 shifts the input of write command in accordance with the write latency, and thereafter issues the same for decoding the shift redundancy.

In the normal operation mode that the address signal and the command signal are applied in accordance with the same timing, latch circuits 380 and 381 issue the data as it is without shifting and delaying the data by one clock cycle.

As described above, the shift setting signal related to the column repairing operation in the write operation is latched, and is shifted by one clock. Owing to this, the input of the address and the determination of the column redundant address in the write operation can be executed in accordance with the timing preceding one clock, and the shift setting in the shift circuit can be completed prior to the actual column access. The operations and manners described above can sufficiently suppress the problem relating to the difference in timing margin before completion of the shift setting between the read and write operations.

The latch circuit is provided also in the column redundancy determining circuit for the read operation, whereby the input of the address and the determination of the redundant address can be executed in accordance with timing preceding one clock, and the shift setting can be completed early.

Fourth Embodiment

A fourth embodiment relates to specific structures of the row redundancy determining circuit and the column redundancy determining circuit, and also relates to the method of executing the test operation relating to the redundant repair.

Figure 24:
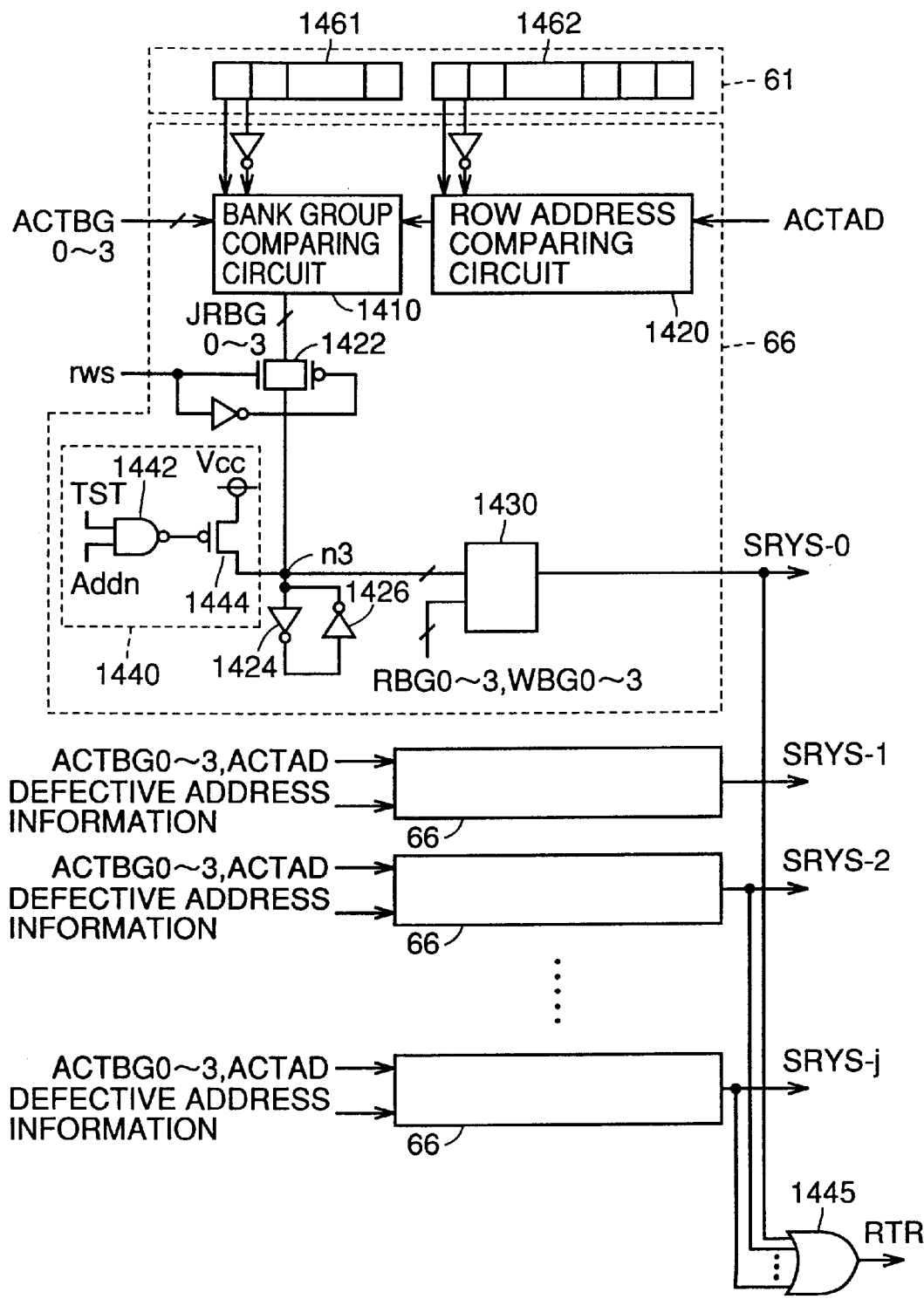
FIG. 24 is a block diagram showing a specific structure of a row redundancy determining circuit 64.

FIG. 24 shows a specific structure of the row redundancy determining circuit 64. As already described with reference to FIG. 10, row redundancy determining circuit 64 includes row redundancy determining sets 66 which correspond in number to the redundant rows. The row redundant repair determination is performed in parallel in the plurality of row redundancy determining sets. When the row redundant repair is necessary, redundant row activating signal SRYS for activating the corresponding redundant row is activated. When at least one of row redundancy determining sets 66 arranged in parallel provides the result of address comparison representing the match, the row redundant repair is instructed. In this case, OR logic gate 1445 issues row redundancy determination signal RTR, which is used in the multiplexer and others.

Redundant data latch circuit 61 shown in FIG. 10 includes a latch circuit 1461 storing the bank group address in the defective row address and a latch circuit 1462 storing the row address.

An output of a row address comparing circuit 1420 is applied to a bank group comparing circuit 1410. Ultimately, bank group comparing circuit 1410 issues to the respective bank groups such determination signals JRBG0–JRBG3 that represent whether the redundant repairing for the corresponding redundant rows are necessary or not.

Figure 25:
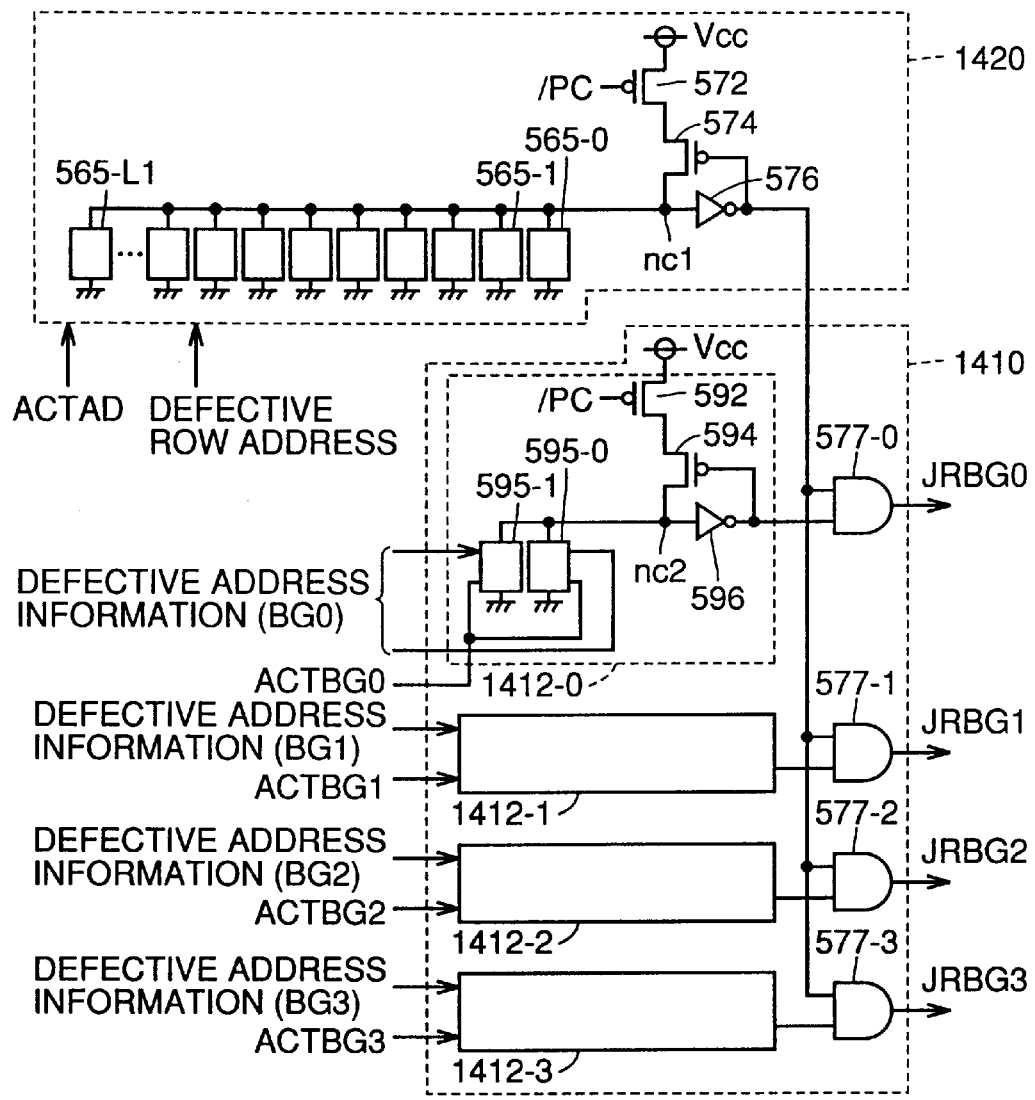
FIG. 25 is a circuit diagram showing specific structures of a bank address comparing circuit 1410 and a row address comparing circuit 1420.

FIG. 25 is a circuit diagram showing specific structures of bank group comparing circuit 1410 and row address comparing circuit 1420 already described with reference to FIG. 24.

Referring to FIG. 25, row address comparing circuit 1420 includes address comparing elements 565-0–565-L1 of L1 in number which are connected in parallel between a common node nc1 and the ground potential. P-channel MOS transistors 572 and 574 are connected between power supply potential Vcc and common node nc1. An inverter 576 inverts the level on common node nc1, and applies the same to the gate of transistor 574. In the normal operation, transistor 572 receiving precharge signal PC on its gate sets common node nc1 to power supply potential Vcc level, and inverters 576 and 574 maintain this state.

Address comparing element 565 is supplied with the defective row address signal and row address signal ACTAD, and makes a comparison between them. Each row address signal is applied as a complementary signal to the address comparing element. For example, address comparing element 565-0 performs the comparison for row address signal ACTAD1 in the first position. Neighboring address comparing element 565-1 performs the comparison for the complementary signal /ACTAD1 of row address signal ACTAD1.

Figure 26:
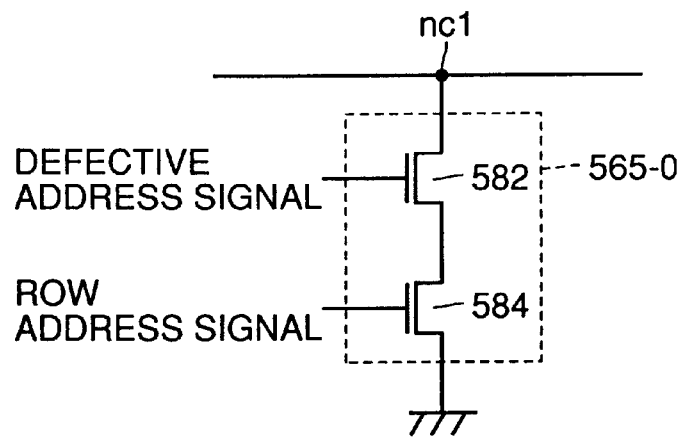
FIG. 26 is a circuit diagram showing a structure of an address comparing circuit.

FIG. 26 is a circuit diagram showing a specific structure of an address comparing element 565.

Referring to FIG. 26, address comparing element 565-0 has N-channel MOS transistors 582 and 584 connected between common node nc1 and the ground potential. Transistor 582 receives on its gate the defective address signal, which is active at Vcc level when the address corresponding to the same is the defective address. The transistor 584 receives on its gate the row address signal.

When the defective address information specifies that the corresponding address is the defective address, and the row address signal ACTAD selects the corresponding address signal, both transistors 582 and 584 are turned on, and the common node nc1 attains Vss level.

Referring to FIG. 25 again, when the selected row address matches with the defective row address, the output of inverter 576 attains Vcc level, and is applied to one of the inputs of an AND logic gate 577.

Bank group comparing circuit 1410 has bank group comparing units 1412-0–1412-3 which are provided corresponding to the respective bank groups for performing the address comparison in the corresponding bank groups, respectively.

Bank group comparing unit 1412-0 has address comparing elements 595-0 and 595-1, which have structures similar to that already described with reference to FIG. 26, and are arranged between a common node nc2 and ground potential Vss. In the case where transistors 592 and 594 precharge common node nc2 to Vcc level, and the defective row address related to the redundant row belongs to bank group BG0, the potential on common node nc2 is set to Vss level. Thereby, the output of inverter 596 is set to Vcc level, and is applied to the other input of AND logic gate 577-0 when the bank group matches with the defective row address related to the corresponding redundant row.

In a similar manner, each of AND logic gates 577-0–577-3 receives a result of comparison of the defective row address for corresponding bank group as well as the result of comparison between the row address signal and the defective row address. By the AND operation between them, circuit 1410 issue signals JRBG0–JRBG3 for determining whether the redundant repair is necessary or not in the corresponding banks.

Referring to FIG. 24 again, control signals JRBG0–JRBG3 issued from bank group comparing circuit 1410 are transmitted to a node n3 via a transfer gate 1422 controlled by a one-shot pulse rws which is activated in accordance with the activation timing of the row-related operation. A latch circuit formed of inverters 1424 and 1426 latches the data transmitted onto node n3.

Row redundant repair necessity determining signals JRBG0–JRBG3, which are issued for the respective bank groups and are transmitted onto node n3, are compared with bank group activating signals RBG0–RBG3 and WBG0–WBG3 which are supplied in accordance with the activation timing of the column-related operation. When it is determined that the row redundant repair is necessary in the row-related operation, and the read or write operation is executed on the bank group requiring the repair, determining circuit 1430 activates redundant row activating signal SRYS for activating the corresponding redundant row.

As already described, redundant row activating signal SRYS is transmitted to the redundant row circuit via the spare row read YS line and the spare row write YS line, whereby the sense amplifier circuit is selectively connected to the spare row read data line and the spare row write data line.

A node n3 is connected to a redundant test circuit 1440. Redundant test circuit 1440 includes a P-channel MOS transistor 1444 connected between power supply potential Vcc and node n3, and an NAND gate 1442 having two inputs receiving a test signal TST and a redundant row designating signal Addn, respectively.

Test signal TST is inactive (Vss level) during the normal circuit operation, and is active (Vcc level) when the redundant repair test is effected on the redundant row circuit. Redundant row designating signal Addn is a signal for selecting the redundant row which is to be subjected to the test for the redundant repair operation. For the redundant row to be subjected to the redundant repair operation test, corresponding row redundant test executing circuit 440 is supplied with control signals TST and Addn in the active state for turning on transistor 444 so that node n3 is set to power supply potential Vcc level. Thereby, the test for the redundant repair operation can be freely executed based on the externally supplied control signal.

Figure 27:
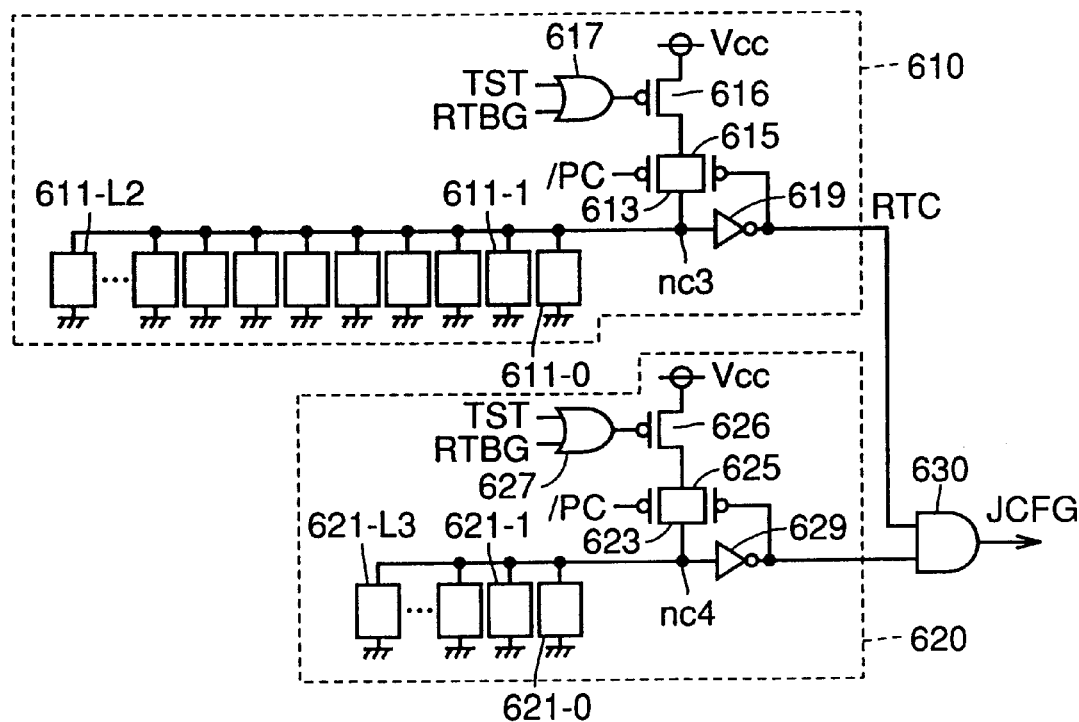
FIG. 27 is a circuit diagram showing a specific structure of a column redundancy determining circuit 67.

FIG. 27 is a circuit diagram showing a specific structure of column redundancy determining set 67.

Referring to FIG. 27, column redundancy determining set 67 includes an address comparing circuit 610 for comparing the column address signal with the defective address, and a bank address comparing circuit 620 for comparing the bank group with the defective address.

Address comparing circuit 610 has address comparing elements 611-1–611-L3 of L3 in number having structures similar to that already described with reference to FIG. 26. Address comparing elements 611-1–611-L3 are connected in parallel between common node nc3 and ground potential Vss.

Address comparing circuit 510 is supplied with column address signal RCAD or WCAD when the column operation is active, and compares the same with bank group address and column address related to the defective column address latched by redundant data latch circuit 62. When they match with each other, common node nc3 is set to Vss level similarly to the case of the row redundancy determining circuit.

P-channel MOS transistors 613, 615 and 616 are arranged between power supply potential Vcc and common node nc3. Transistor 616 receives on its gate an output of an OR logic gate 617, which have two inputs receiving redundant test signal TST and bank group match signal RTBK already described with reference to FIG. 10.

Control signal RTBK is applied to one of inputs of the OR gate, of which output is applied to a gate of transistor 616 to be turned on/off between power supply potential Vcc and common node nc3. Thereby, address match comparing circuit 610 is activated only for the defective column address related to the bank group, in which activation of the column related operation is instructed, in the column redundancy determining units.

Transistors 613 and 616 precharge common node nc3 to power supply potential Vcc. When address comparing circuit 610 determines that the column address matches with the defective address, common node nc3 is set to the Vss level, and control signal RTC is set to Vcc level.

Since control signal TST is used as the other input of OR gate 617, address comparing circuit 610 can be forcedly activated for the test operation. Thus, the test for the redundant repair operation can be freely executed based on activation of externally supplied control signal TST.

Bank address comparing circuit 620 has a structure similar to that of address comparing circuit 610, and makes a comparison of the defective column address for the bank group of which read and write operations are instructed. Bank address comparing circuit 620 can likewise be used for the test of redundant repair operation based on activation of the externally supplied control signal TST.

Owing to the above structures of the row and column redundancy determining sets, the test for the redundant repair operation can be freely executed based on the activation of the test mode signal, which is externally and independently set.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device for reading and writing storage data in accordance with a row address signal and a column address signal, comprising:

a memory cell array having normal memory cells arranged in rows and columns, said memory cell array being divided into memory cell blocks arranged in a first number of rows and a second number of columns;

a plurality of redundant row circuits each provided commonly to said first number of memory cell blocks neighboring in the column direction, said redundant row circuits each including spare storage elements arranged in rows and columns;

a third number of data buses provided commonly to said memory cell blocks for transmitting said storage data to be read or written;

a plurality of data I/O lines for transmitting said storage data, said data I/O lines including a plurality of normal data I/O lines of said third number provided commonly to said first number of memory cell blocks neighboring to each other in the column direction, each of said normal data I/O lines being provided for a fourth number of columns of said normal memory cells, and a plurality of spare row data I/O lines provided corresponding to said normal data I/O lines, respectively, and each provided for said fourth number of columns of said spare storage elements;

a redundant row control circuit for instructing a redundant repair operation when said row address signal matches with at least one of defective row addresses in said normal memory cells; and a data line connection switch circuit controlled by said redundant row control circuit, and selecting one line from each set of said normal I/O line and said spare row data I/O line for connecting the selected lines to the corresponding data buses, respectively.

2. The semiconductor memory device according to claim 1, wherein said redundant row circuits are arranged outside a region containing said memory cell array, and neighbor in the column direction to said region.

3. The semiconductor memory device according to claim 1, wherein said redundant row control circuit includes a plurality of row address comparing circuits provided for said defective row addresses, respectively;

each of said row address comparing circuits has:

an output node outputting a row replacement instructing signal, an address signal comparing unit for connecting said output node to a first potential corresponding to the active state of said row replacement instructing signal when said row address signal matches with a corresponding one of said defective row addresses, and a spare row test circuit for connecting said output node to said first potential in accordance with activation of an externally supplied spare row test signal; and said data line connection switch circuit selects said spare row data I/O line when a corresponding one of the row replacement instructing signals is active, and selects said normal data I/O line when the corresponding one of row replacement instructing signals is inactive.

4. The semiconductor memory device according to claim 1, wherein each of said memory cell blocks allows a read operation and a write operation independently of each other, and said memory cell blocks of said second number neighboring to each other in the row direction can be activated simultaneously.

5. The semiconductor memory device according to claim 1, wherein said redundant row circuit further includes:

sub-bit lines arranged for columns of said spare storage elements, respectively, and a plurality of spare row select gates, provided for every said fourth number of sub-bit lines, each for selectively connecting one of said fourth number of sub-bit lines to a corresponding one of said spare row data I/O lines in accordance with said row replacement instructing signals.

6. The semiconductor memory device according to claim 1, wherein said normal data I/O lines include:

a plurality of normal read data lines for transmitting said storage data in a read operation, and a plurality of normal write data lines for transmitting said storage data in a write operation; and said spare row data I/O lines include:

a plurality of spare row read data lines for transmitting said storage data in said read operation, and a plurality of spare row write data lines for transmitting said storage data in said write operation.

7. A semiconductor memory device for reading and writing storage data in accordance with a row address signal and a column address signal, comprising:

a memory cell array having normal memory cells arranged in rows and columns, said memory cell array being divided into memory cell blocks arranged in a first number of rows and a second number of columns;

a plurality of redundant column circuits each provided commonly to said second number of memory cell blocks neighboring in the row direction, said redundant column circuits including storage elements arranged in rows and columns;

a third number of data buses provided commonly to said memory cell blocks for transmitting said storage data to be read or written;

a plurality of data I/O lines for transmitting said storage data, said data I/O lines including a plurality of normal data I/O lines of said third number provided commonly to said first number of memory cell blocks neighboring to each other in the column direction, each of said normal data I/O lines being provided for a fourth number of columns of said normal memory cells, and a plurality of spare column data I/O lines each arranged for said fourth number of columns of said spare storage elements;

a redundant column control circuit for instructing a redundant repair operation when said column address signal matches with at least one of defective column addresses in said normal memory cells; and a data line connection switch circuit controlled by said redundant column control circuit to connect said third number of lines selected from said normal data I/O lines and said spare column data I/O lines to said third number of data buses, respectively.

8. The semiconductor memory device according to claim 7, wherein said redundant column circuits are arranged outside a region containing said memory cell array, and neighbor in the row direction to said region.

9. The semiconductor memory device according to claim 7, wherein said normal data I/O lines include:
a plurality of normal read data lines for transmitting said storage data in a read operation, and
a plurality of normal write data lines for transmitting said storage data in a write operation; and said spare column data I/O lines include:
a plurality of spare column read data lines for transmitting said storage data in said read operation, and
a plurality of spare column write data lines for transmitting said storage data in said write operation.

10. The semiconductor memory device according to claim 7, wherein each of said memory cell blocks allows a read operation and a write operation independently of each other, and said memory cell blocks of said second number neighboring to each other in the row direction can be activated simultaneously.

11. The semiconductor memory device according to claim 7, wherein said redundant column control circuit issues shift control signals and spare column switch signals;

said third number is L (L: natural number); and said data line connection switch circuit includes:
a normal data line shift circuit for connecting, in response to said shift control signals, L–M said normal data I/O lines except for the M normal data I/O lines (M: integer from 0 to L) corresponding to the normal memory cell columns containing defects to said data buses in the first to (L–M)th positions, respectively, and
a spare column data line switch circuit for connecting, in response to said spare column switch signals, respective ones of said (L–M+1)th to Lth data buses to any of said spare column data I/O lines when M exceeds zero.

12. The semiconductor memory device according to claim 11, wherein said redundant column circuits have N said spare column data I/O lines (N: natural number);

said normal data line shift circuit includes N shift unit circuits connected in series for transmitting data from said third number of normal data I/O lines to said third number of data buses;

each of said shift unit circuits has:
L input nodes,
first to Lth shift switches provided corresponding to said input nodes, respectively, and
L output nodes connected respectively to said input nodes via said shift switches; wherein
the first to the Lth shift switches except for the ith shift switch (i: natural number of 1 to L) connect the first to the Lth input nodes except for the ith input node respectively with the first to the (L–1)th output nodes, and the ith shift switch is in a disconnecting state when the ith shift switch is designated to be skipped over by said shift control signals
the input nodes of said shift unit circuit in the first position are connected to said third number of normal data I/O lines, respectively, and the output nodes of said shift unit circuit in an Nth position are connected to said third number of data buses, respectively;

said spare column data line switch circuit includes spare column connection units provided for N said spare column data I/O lines, respectively; and each of said spare column connection units selectively connects a corresponding one of said spare column data I/O lines to one of said data buses in the (L–N) to Lth positions in response to a corresponding one of said spare column switch signals.

13. The semiconductor memory device according to claim 7, wherein said redundant column control circuit issues shift control signals and spare column switch signals;

said third number is L (L: natural number); and said normal data I/O lines include:
a plurality of normal read data lines for transmitting said storage data in a read operation, and
a plurality of normal write data lines for transmitting said storage data in a write operation;

said spare column data I/O lines include:
a plurality of spare column read data lines for transmitting said storage data in said read operation, and
a plurality of spare column write data lines for transmitting said storage data in said write operation;

said data line connection switch circuit includes a read data line connection circuit and a write data line connection circuit operating in the read operation and the write operation, respectively;

said redundant column control circuit applies said shift control signals and said spare column switch signals to each of said read data line connection circuit and said write data line connection circuit;

said read data line connection circuit includes:
   a normal read data line shift circuit for connecting, in response to said shift control signals, (L−M) said normal read data lines of except for the M normal read data lines (M: integer from 0 to L) corresponding to the normal memory cell columns containing defects to said data buses in the first to (L−M)th positions, respectively, and
   a spare column read data line switch circuit for connecting, in response to said spare column switch signals, respective ones of said (L−M+1)th to Lth data buses to any of said spare column read data lines when M exceeds zero; and said write data line connection circuit includes:
a normal write data line shift circuit for connecting, in response to said shift control signals, (L−M) said normal write data lines except for the M normal write data lines (M: integer from 0 to L) corresponding to the normal memory cell columns containing defects to said data buses in the first to (L−M)th positions, respectively, and
a spare column write data line switch circuit for connecting, in response to said spare column switch signals, respective ones of said (L−M+1)th to Lth data buses to any of said spare column write data lines when M exceeds zero.

14. The semiconductor memory device according to claim 7, wherein
said redundant column control circuit includes:
   a plurality of column address comparing circuits provided for said defective column addresses respectively, and each making a comparison between a corresponding one of defective column addresses and said column address signal,
   a data line switch signal storing circuit for storing shift control signals and spare column switch signals corresponding to each of said respective defective column addresses, and
   a data line switch signal generating circuit for selectively reading from said data line switch signal storing circuit said shift control signals and said spare column switch signals corresponding to said defective column address matching with said column address signal in accordance with the result of comparison by said column address comparing circuits.

15. The semiconductor memory device according to claim 14, wherein
said memory cell array is divided into a plurality of memory cell block groups each having said memory cell blocks neighboring in the row direction;
said semiconductor memory device further comprising a group address comparing circuit, provided for said column address comparing circuits, for detecting which of said memory cell block groups is selected according to said row address signal and activating memory cell block match signals each indicating the selected memory cell block group; and wherein
each of said column address comparing circuits is selectively activated in response to an externally applied redundant column test signal and a corresponding one of said memory cell block match signals.

16. A semiconductor memory device for reading and writing storage data in accordance with a row address signal and a column address signal, comprising:
   a memory cell array having normal memory cells arranged in rows and columns,
      said memory cell array being divided into memory cell blocks arranged in a first number of rows and a second number of columns;
   a plurality of redundant row circuits each provided commonly to said first number of memory cell blocks neighboring in the column direction,
   said redundant row circuits including spare storage elements arranged in rows and columns;
   a plurality of redundant column circuits each provided commonly to said second number of memory cell blocks neighboring in the row direction,
   said redundant column circuits including spare memory cells arranged in rows and columns;
   a third number of data buses provided commonly to said memory cell blocks for transmitting said storage data to be read or written;
   a plurality of data I/O lines for transmitting said storage data, said data I/O lines including
   a plurality of normal data I/O lines of said third number provided commonly to said first number of memory cell blocks neighboring to each other in the column direction, each of said normal data I/O lines being provided for a fourth number of columns of said normal memory cells, and
   a plurality of spare row data I/O lines provided corresponding to said third number of normal data I/O lines, respectively, and each arranged for said fourth number of columns of said memory cells, and spare column data I/O lines each provided for said fourth number of columns of said spare storage elements;
   a redundant row control circuit for generating row replacement instructing signals when said row address signal matches with at least one of defective row addresses in said normal memory cells;
   a redundant column control circuit for generating data line shift control signals instructing a redundant repair operation when said column address signal matches with at least one of defective column addresses in said normal memory cells;
   a first data line connection switch circuit selecting one line from each set of said normal data I/O line and said spare row data I/O line in accordance with said row replacement instructing signals; and
   a second data line connection switch circuit for selectively connecting the third number of lines among said data I/O lines selected by said first data line connection switch circuit and said spare column data I/O lines to said third number of data buses in accordance with said data line shift control signals, respectively.

17. The semiconductor memory device according to claim 16, wherein
said plurality of data I/O lines include:
   a plurality of read data I/O lines for transmitting said storage data in a read operation, and
   a plurality of write data I/O lines for transmitting said storage data in a write operation;
said normal data I/O lines include:
   a plurality of normal read data lines for transmitting said storage data in said read operation, and a plurality of normal write data lines for transmitting said storage data in said write operation;

said spare row data I/O lines include:
- a plurality of spare row read data lines for transmitting said storage data in said read operation, and
- a plurality of spare row write data lines for transmitting said storage data in said write operation;

said spare column data I/O lines include:

a plurality of spare column read data lines for transmitting said storage data in said read operation, and a plurality of spare column write data lines for transmitting said storage data in said write operation;

said first data line connection switch circuit includes a first read data line connection circuit and a first write data line connection circuit operating in the read operation and the write operation, respectively;

said first read data line connection circuit selecting one from each set of said normal read data line and said spare row read data line in accordance with said row replacement instructing signals;

said first write data line connection circuit selecting one from each set of said normal write data line and said spare row write data line in accordance with said row replacement instructing signals;

said second data line connection switch circuit includes a second read data line connection circuit and a second write data line connection circuit operating in the read operation and the write operation, respectively;

said second read data line connection circuit selectively connects the third number of read data lines among said read data I/O lines selected by said first read data line connection circuit and said spare column read data lines to said third number of data buses in accordance with said data line shift control signals;

said second write data line connection circuit selectively connects the third number of write data lines among said write data I/O lines selected by said first write data line connection circuit and said spare column write data lines to said third number of data buses in accordance with said data line shift control signals; and said redundant column control circuit includes:
- a read redundant column control circuit for instructing the redundant repair operation in the read operation, and
- a write redundant column control circuit for instructing the redundant repair operation in the write operation.

18. The semiconductor memory device according to claim 17, wherein said write redundant column control circuit generates a write data line shift control signal corresponding to said defective column address when said column address signal for the instructed write operation matches with said defective column address, and has a write data line shift control signal latch circuit for holding said write data line shift control signal; and said second write data line connection circuit selectively connects the third number of write data lines selected by said first write data line connection circuit to said third number of data buses in accordance with the output of said write data line shift control signal latch circuit.

19. The semiconductor memory device according to claim 17, wherein said read redundant column control circuit generates a read data line shift control signal corresponding to said defective column address when said column address signal for the instructed read operation matches with said defective column address, and has a read data line shift control signal latch circuit for holding said second read data line shift control signal; and said read data line connection circuit selectively connects the third number of read data lines selected by said first read data line connection circuit to said third number of data buses in accordance with the output of said read data line shift control signal latch circuit.

* * * * *